(12) United States Patent
Zalik et al.

(10) Patent No.: US 9,300,321 B2
(45) Date of Patent: Mar. 29, 2016

(54) LIGHT DETECTION AND RANGING (LIDAR)DATA COMPRESSION AND DECOMPRESSION METHODS AND APPARATUS

(75) Inventors: Borut Zalik, Kamnica (SI); Domen Mongus, Podgorje pri Slovenj Gradcu (SI)

(73) Assignee: University of Maribor, Maribor (SI)

( * ) Notice: Subject to any disclaimer, the term of this patent is extended or adjusted under 35 U.S.C. 154(b) by 1003 days.

(21) Appl. No.: 13/289,839

(22) Filed: Nov. 4, 2011

(65) Prior Publication Data

US 2012/0124113 A1 May 17, 2012

Related U.S. Application Data

(60) Provisional application No. 61/410,522, filed on Nov. 5, 2010.

(51) Int. Cl.
| | |
|---|---|
| *G06F 17/50* | (2006.01) |
| *H03M 7/40* | (2006.01) |
| *G06T 9/00* | (2006.01) |
| *G06K 9/00* | (2006.01) |
| *H03M 7/30* | (2006.01) |

(52) U.S. Cl.
CPC . *H03M 7/40* (2013.01); *G06K 9/00* (2013.01); *G06T 9/00* (2013.01); *H03M 7/3075* (2013.01); *H03M 7/6011* (2013.01)

(58) Field of Classification Search
CPC .................................................. H03M 7/3075
USPC ......................................................... 708/203
See application file for complete search history.

(56) References Cited

U.S. PATENT DOCUMENTS

| | | | |
|---|---|---|---|
| 5,418,532 A | 5/1995 | Lei | |
| 5,546,080 A | 8/1996 | Langdon, Jr. et al. | |
| 5,793,371 A | 8/1998 | Deering | |
| 5,867,167 A | 2/1999 | Deering | |
| 5,870,094 A | 2/1999 | Deering | |
| 5,988,862 A * | 11/1999 | Kacyra ................. | G01B 11/002 382/195 |
| 6,239,805 B1 * | 5/2001 | Deering ................. | G06T 9/001 345/419 |
| 6,314,205 B1 | 11/2001 | Masuda et al. | |
| 7,046,841 B1 * | 5/2006 | Dow ...................... | G01C 11/00 345/419 |
| 7,187,452 B2 | 3/2007 | Jupp et al. | |
| 7,266,149 B2 * | 9/2007 | Holcomb .............. | H04N 19/136 375/240.12 |
| 7,373,473 B2 * | 5/2008 | Bukowski ......... | G06F 17/30241 701/532 |
| 7,701,558 B2 | 4/2010 | Walsh et al. | |
| 7,737,870 B1 | 6/2010 | Wang | |

(Continued)

FOREIGN PATENT DOCUMENTS

WO WO/00/77740 12/2000

OTHER PUBLICATIONS

Google search history log.pdf.*

(Continued)

*Primary Examiner* — William C Vaughn, Jr.
*Assistant Examiner* — Luis Perez Fuentes
(74) *Attorney, Agent, or Firm* — Dugan & Dugan, P.C.

(57) ABSTRACT

Methods and apparatus for lossless LiDAR LAS file compression and decompression are provided that include predictive coding, variable-length coding, and arithmetic coding. The predictive coding uses four different predictors including three predictors for x, y, and z coordinates and a constant predictor for scalar values, associated with each LiDAR data point.

54 Claims, 23 Drawing Sheets

(56) References Cited

U.S. PATENT DOCUMENTS

| | | | |
|---|---|---|---|
| 7,746,449 B2 | 6/2010 | Ray et al. | |
| 8,411,975 B2* | 4/2013 | Lee | H04N 19/00 382/238 |
| 8,749,797 B1* | 6/2014 | Granade | G01S 5/163 356/401 |
| 2002/0050992 A1 | 5/2002 | Deering | |

OTHER PUBLICATIONS

Maune, D. F. "Aerial mapping and surveying" found in "Land Development Handbook: Planning, Engineering, and Surveying, Third Edition", Sidney O. Dewberry and L.N. Rauenzahn (Eds), pp. 877-910, New York, McGraw-Hill Professional, 2008.

Huffman, "A Method for the Construction of Minimum-Redundancy Codes", Proc. of the I.R.E., pp. 1098-1102, 1952.

Deering, "Geometry Compression", Proc. of the 22nd annual conference on Computer graphics and interactive techniques, pp. 13-20, 1995.

Rissanen & Langdon "Arithmetic coding", IBM Journal of Research and Development, 23(2), pp. 149-162, 1979.

* cited by examiner

| VALUES | | DESCRIPTION BYTE | | |
|---|---|---|---|---|
| $-2147483648_{10}$ TO | $-16777216_{10}$ ↔ | 0 0 0 0 | 1 0 0 | 1 |
| $-16777215_{10}$ TO | $-65536_{10}$ ↔ | 0 0 0 0 | 0 1 1 | 1 |
| $-65535_{10}$ TO | $-256_{10}$ ↔ | 0 0 0 0 | 0 1 0 | 1 |
| $-255_{10}$ TO | $-1_{10}$ ↔ | 0 0 0 0 | 0 0 1 | 1 |
| | $0_{10}$ ↔ | 0 0 0 0 | 0 0 0 | 0 |
| $1_{10}$ TO | $255_{10}$ ↔ | 0 0 0 0 | 0 0 1 | 0 |
| $256_{10}$ TO | $65535_{10}$ ↔ | 0 0 0 0 | 0 1 0 | 0 |
| $65536_{10}$ TO | $16777215_{10}$ ↔ | 0 0 0 0 | 0 1 1 | 0 |
| $16777216_{10}$ TO | $2147483647_{10}$ ↔ | 0 0 0 0 | 1 0 0 | 0 |

*FIG. 14*

LIGHT DETECTION AND RANGING (LIDAR) DATA COMPRESSION AND DECOMPRESSION METHODS AND APPARATUS

CROSS-REFERENCE TO RELATED APPLICATIONS

The present invention is related to and claims priority from U.S. Provisional Patent No. 61/410,522, entitled "A METHOD AND APPARATUS FOR LiDAR DATA COMPRESSION AND DECOMPRESSION," which was filed Nov. 5, 2010, and which is hereby incorporated herein for all purposes.

FIELD OF THE INVENTION

The present invention relates to processing of Light Detection and Ranging (LiDAR) data and more specifically, to compression and decompression of LiDAR data.

BACKGROUND OF THE INVENTION

LiDAR (Light Detection And Ranging, also referred to as "LADAR") is an optical remote sensing technology used to measure the distance to, or other properties of, a target by illuminating the target with light, often using pulses from a laser. LiDAR technology has application in geomatics, archaeology, geography, geology, geomorphology, seismology, forestry, remote sensing and atmospheric physics, as well as in airborne laser swath mapping (ALSM), laser altimetry and LiDAR contour mapping.

LiDAR may use ultraviolet, visible, or near infrared light to image objects and may be used with a wide range of targets, including non-metallic objects, rocks, rain, chemical compounds, aerosols, clouds and even single molecules. A narrow laser beam may be used to map physical features with very high resolution. LiDAR has been used extensively for atmospheric research and meteorology. Downward-looking LiDAR instruments fitted to aircraft and satellites may be used for surveying and mapping, a recent example being the NASA Experimental Advanced Research LiDAR.

Wavelengths in the range of about 10 micrometers to the UV (ca. 250 nm) may be used to suit the target. Typically light is reflected via backscattering. Different types of scattering are used for different LiDAR applications; common types include Rayleigh scattering, Mie scattering and Raman scattering, as well as fluorescence. Based on the type of backscattering used, the LiDAR may be accordingly referred to as Rayleigh LiDAR, Mie LiDAR, Raman LiDAR and Na/Fe/K Fluorescence LiDAR and so on.

In some LiDAR systems, the distance to a remote object may be determined based on the time delay between transmission of the laser pulse and detection of the reflection of the pulse as described, for example, in U.S. Pat. Nos. 7,746,449 and 7,701,558, which are hereby incorporated herein for all purposes. Additional information about detected remote objects may be obtained by analysis of the reflected signal as described in U.S. Pat. No. 7,187,452, which is also hereby incorporated herein for all purposes.

By utilizing a relatively short wavelength signal, LiDAR is able to be used to achieve a high level of accuracy in detecting remote objects and may be used to make over 200,000 measurements per second using currently available commercial LiDAR systems. As such, LiDAR is capable of capturing relatively large amounts of highly accurate and dense data in a very short period of time. Another example of a similar LiDAR system is described in U.S. Pat. No. 5,988,862 which is hereby incorporated herein for all purposes.

Among various LiDAR systems, Airborne LiDAR is especially important for gathering information about the Earth's surface. In such systems, a LiDAR data scanner may be mounted on an airborne platform. The current position of the LiDAR scanner may be determined using a global positioning system (GPS), while an inertial measurement unit (IMU) may be used to measure the roll, pitch and heading of the aircraft to establish an angular orientation of the LiDAR sensor. Using the angular orientation of the LiDAR sensor and by measuring the scan angle, the angular orientation of emitted laser pulses are established and the precise positions of surveyed points can be accurately defined. Recorded points may then be projected onto one of the local geographic coordinate systems (e.g., the Gauss-Kruger coordinate system) or a global geographic coordinate system (e.g., the Universal Transverse Mercator coordinate system). Furthermore, because the LiDAR systems are capable of distinguishing between different reflections of the emitted laser pulse points, the Earth's surface, even below vegetation, can be mapped. A more detailed explanation of how LiDAR operates may be found, for example, in Maune, D. F. "Aerial mapping and surveying" found in "Land Development Handbook: Planning, Engineering, and Surveying, Third Edition", Sidney O. Dewberry and L. N. Rauenzahn (Eds), pp. 877-910, New York, McGraw-Hill Professional, 2008 which is hereby incorporated herein for all purposes.

The leading open (i.e., non-proprietary) industrial standard for storing and exchanging data collected by LiDAR systems is defined in the "LAS Specification" published by The American Society for Photogrammetry & Remote Sensing (ASPRS), based in Bethesda, Md. This specification is an open binary file format that details LASer (LAS) file format data exchange information. Although there are slight differences between different revisions of the LAS file format specifications, these specifications all prescribe points to be represented by xyz-coordinates and associated scalar values (e.g., intensity of reflected signal, a color of a point, or user specific data). Because of the capabilities of the LiDAR systems, LAS files often contain several tens of millions of points and the file size can easily exceed a few gigabytes per square kilometer mapped. Storage of LAS files may therefore be expensive and file exchange over local networks and the Internet may become impractical. Because of these factors, an efficient compression method for LiDAR data is needed.

Entropy encoding algorithms may be used for this purpose. For example, U.S. Pat. Nos. 5,418,532, 5,546,080, and 7,737,870 (all of which are hereby incorporated herein by reference for all purposes) describe some of the many general purpose compression methods. Other publications may also be consulted, for example Huffman, "*A Method for the Construction of Minimum-Redundancy Codes*", Proc. of the I.R.E., pp. 1098-1102, 1952, and Rissanen & Langdon "*Arithmetic coding*", IBM Journal of Research and Development, 23(2), pp. 149-162, 1979, both of which are hereby incorporated herein by reference for all purposes. Still, the entropy encoding algorithms are not efficient when compressing geometrical data. For this purpose, domain specific algorithms have been introduced.

However, geometrical data compression is still a relatively new area. One of the earliest methods has been presented in Taubin & Rossignac "*Geometric compression through topological surgery*", ACM Transactions on Graphics, 17, pp. 84-115, 1998, which is hereby incorporated herein by reference for all purposes. The method compresses the geometry of the triangle mesh as well as the topology. For this purpose, the triangle mesh is divided into triangular strips. The vertices are arranged according to their appearances in the triangular strips and coded with a linear prediction schema. Instead of storing the absolute coordinates, only differences between the predicted and the actual positions of vertices are stored. Similar methods that achieve geometrical data compression by forming triangle meshes are also described in U.S. Pat. Nos. 5,793,371; 5,867,167; 5,870,094; 6,239,805; 6,314,205; and Publication Nos. WO/2000/077740 and US 2002050992; and in other publications, for example Deering, "*Geometry compression*", Proc. of the 22nd annual conference on Computer graphics and interactive techniques, pp. 13-20, 1995, all of which are hereby incorporated herein by reference for all purposes. Still, due to a need for the topology, these methods cannot be directly applied to LiDAR datasets.

Thus, what is needed are methods and apparatus for compressing three dimensional (3D) datasets (e.g., LAS data files) using domain-specific information about the 3D data scanning.

SUMMARY OF THE INVENTION

In some embodiments, the present invention provides a method for compressing three dimensional point data. The method includes receiving a dataset to be compressed, the dataset including a plurality of data points in a sequence, the data points each including at least four types of attribute values, the attribute value types including an X-coordinate value type, a Y-coordinate value type, a Z-coordinate value type, and at least one associated scalar value type; applying predictive coding to a sequence of attribute values of a same type from the dataset to generate a sequence of prediction errors for a given attribute value type; applying variable length coding to the sequence of prediction errors to generate byte-streams of variable length codes; and compressing the byte-streams of variable length codes using entropy coding.

In some other embodiments, the present invention provides a medium including a non-transitory computer-readable medium having computer-executable instructions adapted to cause a computer to receive a dataset to be compressed, the dataset including a plurality of data points in a sequence, the data points each including at least four types of attribute values, the attribute value types including an X-coordinate value type, a Y-coordinate value type, a Z-coordinate value type, and at least one associated scalar value type; apply predictive coding to a sequence of attribute values of a same type from the dataset to generate a sequence of prediction errors for a given attribute value type; apply variable length coding to the sequence of prediction errors to generate byte-streams of variable length codes; and compress the byte-streams of variable length codes using entropy coding.

In yet other embodiments, the present invention provides a computer programmed to compress three dimensional point data. The computer includes a processor; and a memory coupled to the processor and operable to store computer-executable instructions adapted to cause the computer to receive a dataset to be compressed, the dataset including a plurality of data points in a sequence, the data points each including at least four types of attribute values, the attribute value types including an X-coordinate value type, a Y-coordinate value type, a Z-coordinate value type, and at least one associated scalar value type; apply predictive coding to a sequence of attribute values of a same type from the dataset to generate a sequence of prediction errors for a given attribute value type; apply variable length coding to the sequence of prediction errors to generate byte-streams of variable length codes; and compress the byte-streams of variable length codes using entropy coding.

Numerous other aspects are provided in accordance with these and other aspects of the invention. Other features and aspects of the present invention will become more fully apparent from the following detailed description, the appended claims, and the accompanying drawings.

BRIEF DESCRIPTION OF THE DRAWINGS

FIG. 14 is a schematic diagram illustrating description bytes assigned to values according to example embodiments of the methods of the present invention.

DETAILED DESCRIPTION

Figure 1:
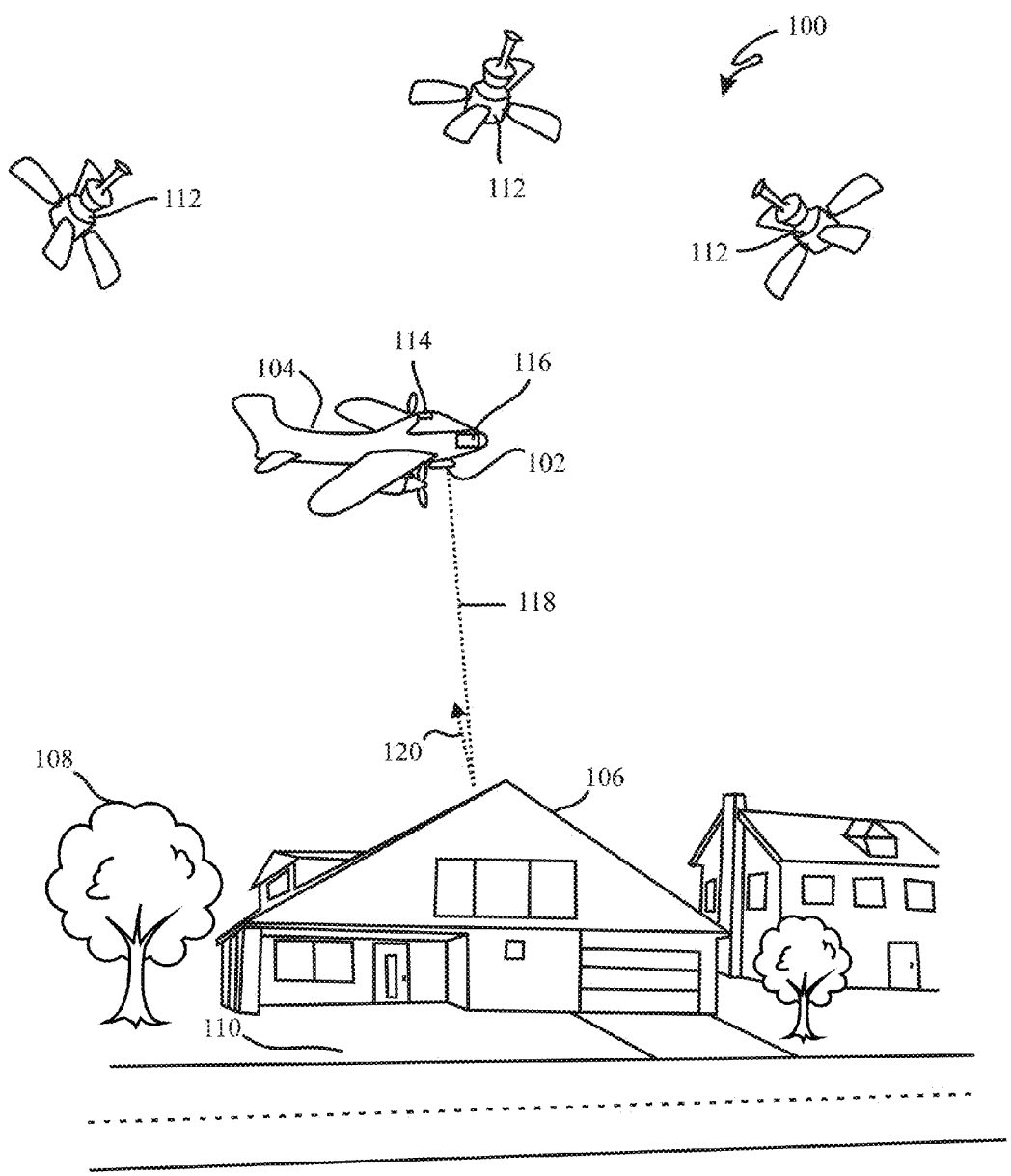
FIG. 1 is a schematic diagram depicting en environment for collecting LiDAR data in accordance with embodiments of the present invention.

The present invention provides methods and apparatus for compressing three dimensional (3D) datasets (e.g., LAS data files) using domain-specific information about the 3D data scanning. In accordance with the present invention, single-rate, lossless compression of 3D point clouds and related scalar values is achieved. The data points in the 3D datasets each include x,y,z coordinate values and the related scalar values. The correlation between the data points is exploited using a predictive coding method. The data points are encoded based on the difference between their value and their predicted value. Thus, only the differences in the two values are needed to recover the data points. The substantial amount of data that can be accurately predicted need not be stored and thus, the resulting encoded representation of the 3D dataset can be significantly smaller than the original dataset.

In the prediction model according to embodiments of the present invention, three rules (e.g., one for each dimension) may be used to predict the positions (e.g., x, y, z values) of the data points and two rules may be used to predict the associated scalar values. To minimize the difference between actual values and predicted values, the scalar values may be predicted using either a constant prediction rule or a linear prediction rule. The constant prediction rule simply presumes that the values of the same attribute of two successive or adjacent data points are the same. The linear prediction rule is used for attributes that continuously change but in a consistent, linear manner such as a GPS clock time. In other words, because the GPS time of a point recording cannot be equal for two successive points but may only vary by a fixed or known amount, a linear prediction rule is used for predicting such values.

Similarly, the positions of successive points will not be the same, and different prediction rules may be applied for this purpose. A prediction rule for predicting an x-coordinate value may estimate the value based on the average distance and standard deviation between x-coordinate values of the last few (e.g. ten) points.

A prediction rule for predicting y-coordinate values may exploit the difference between successive points' x-coordinate value to predict the y-coordinate of the coded point. For example, the y-coordinate value prediction rule may assume that a large distance between x-coordinate values indicates or suggests an equally large distance between the y-coordinate values. Thus, the history of the coded points may be searched to find two successive points with similar differences in the x-coordinate values.

A prediction rule for predicting z-coordinate may apply a similar concept as the prediction rule for y-coordinate values. However, such a z-coordinate prediction rule may use both x and y coordinate values.

After the predictive coding is applied to the 3D dataset, the absolute values of the prediction errors (e.g., the differences between the actual values and the predicted values) may be coded using variable-length-coding (VLC). Using VLC, a description byte is added to each value, where the information describing sign and length (in bytes) of each value is stored. Thus, the zero-bytes can be removed from each value in the VLC encoded dataset to create a substantially smaller compressed dataset. The VLC encoded dataset may be compressed using an entropy encoding method such as, for example, arithmetic coding (AC) and the compressed dataset may be archived.

The invention will now be presented with reference to the accompanying drawings wherein specific example embodiments of the invention are depicted to more clearly illustrate the invention. Despite the inclusion of numerous specific details however, it will be apparent to those of skill in the art that the presented invention can be practiced without these specifics. In some instances, well-known structures and devices are shown in block diagram form, rather than in detail, in order to avoid obscuring the present invention. Also note that some portions of the detailed description are presented in terms of symbolic representations. Although the invention is described using Airborne Light Detection and Ranging (Airborne LiDAR) technology as an example, it will be apparent that the present invention may be practiced with any kind of 3D point-cloud data.

The present invention also encompasses various apparatus for performing the methods described herein. These apparatus may be specially constructed for the required purposes, or in some embodiments a programmed general purpose computer may be used. In addition, the present invention is not described with reference to any particular programming language. It will be appreciated that a variety of programming languages may be used to implement the teachings of the invention as described herein.

Turning now to FIG. 1, an illustration of an example environment 100 in which LiDAR data may be gathered according to embodiments of the present invention is provided. In some embodiments, an Airborne LiDAR data scanner 102 may be mounted on an airborne platform 104 (e.g., an airplane although other aircraft may be used) where the scanner 102 may be employed to gather three dimensional (3D) information about Earth's surface over an area of interest. The example area depicted in FIG. 1 includes an urban area with various objects such as houses 106, trees 108 and ground 110. In operation, the position of the LiDAR system at any given time may be continuously determined using the global positioning system (GPS) which includes GPS satellites 112 and at least one GPS antenna 114 mounted on the airborne platform 104. Other systems adapted to provide location information of the airborne platform 104 may be used.

An inertial measurement unit 116 (IMU) may be used to continuously measure the roll, pitch and heading of the airborne platform 104 which is used to establish the angular orientation of the LiDAR sensor. Other devices adapted to provide roll, pitch and heading of the airborne platform 104 may be used. While in flight, laser pulses (e.g., laser pulse 118) are continuously emitted by the LiDAR data scanner 102 to measure the distance from the airborne platform's current position to points on target objects (e.g., houses 106, trees 108 and ground 110). By analyzing and processing of the reflections of the laser pulses (e.g., laser pulse 120) the position and additional attributes of each recorded point may be defined.

Figure 2:
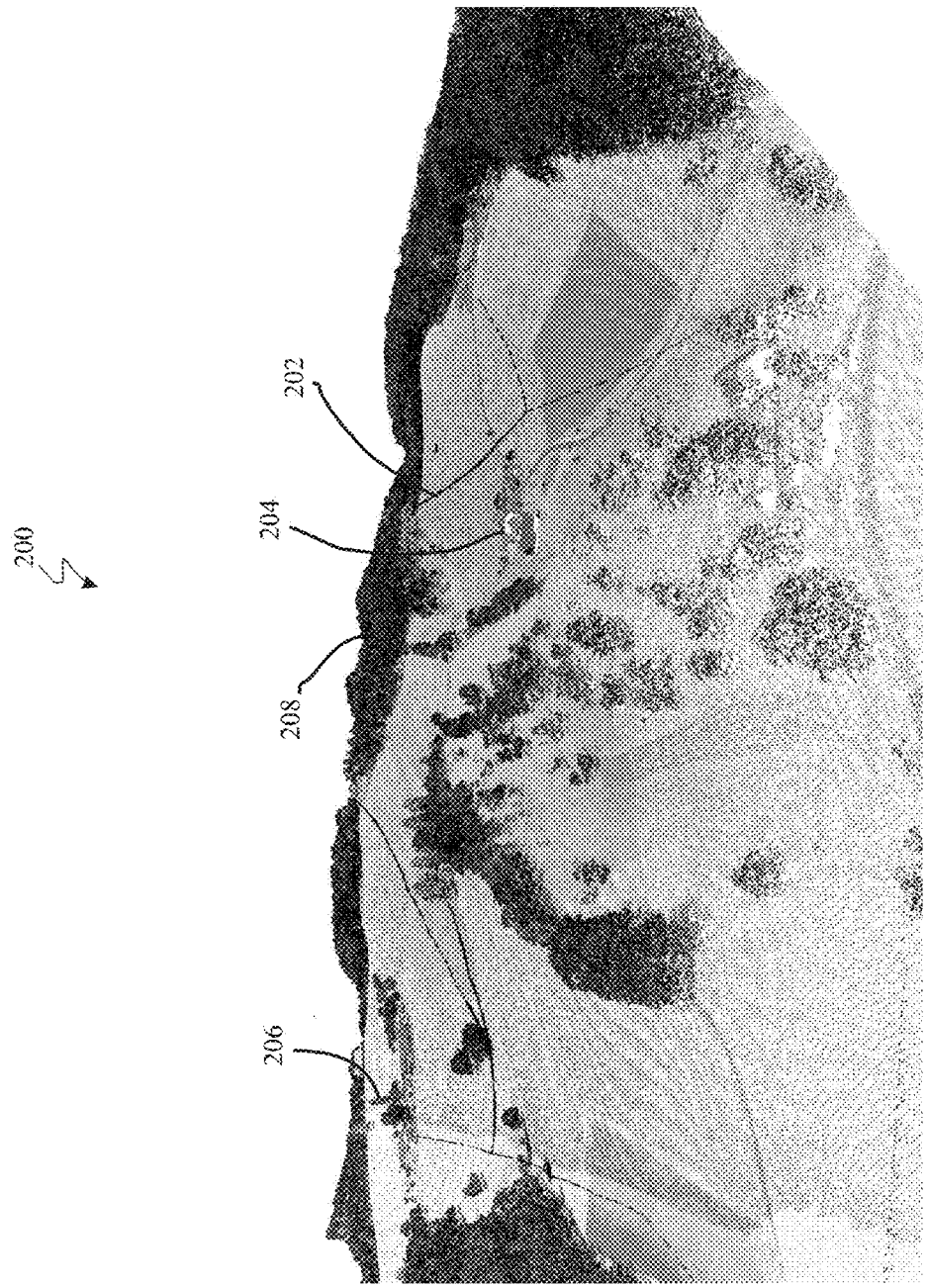
FIGS. 2 to 4 are graphical representations of LiDAR datasets which embodiments of the presented invention may be used to compress.
Figure 3:
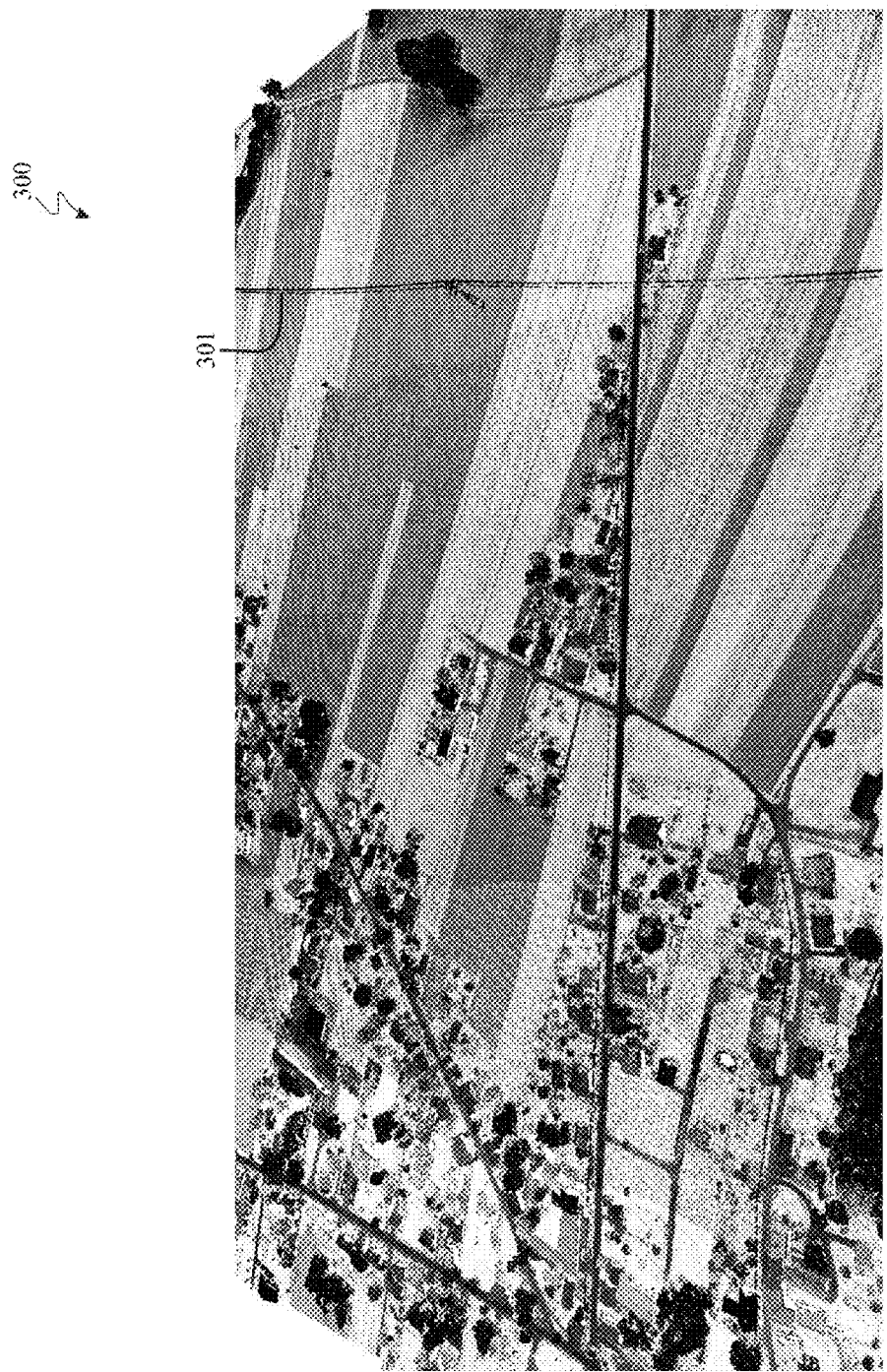
Figure 4:
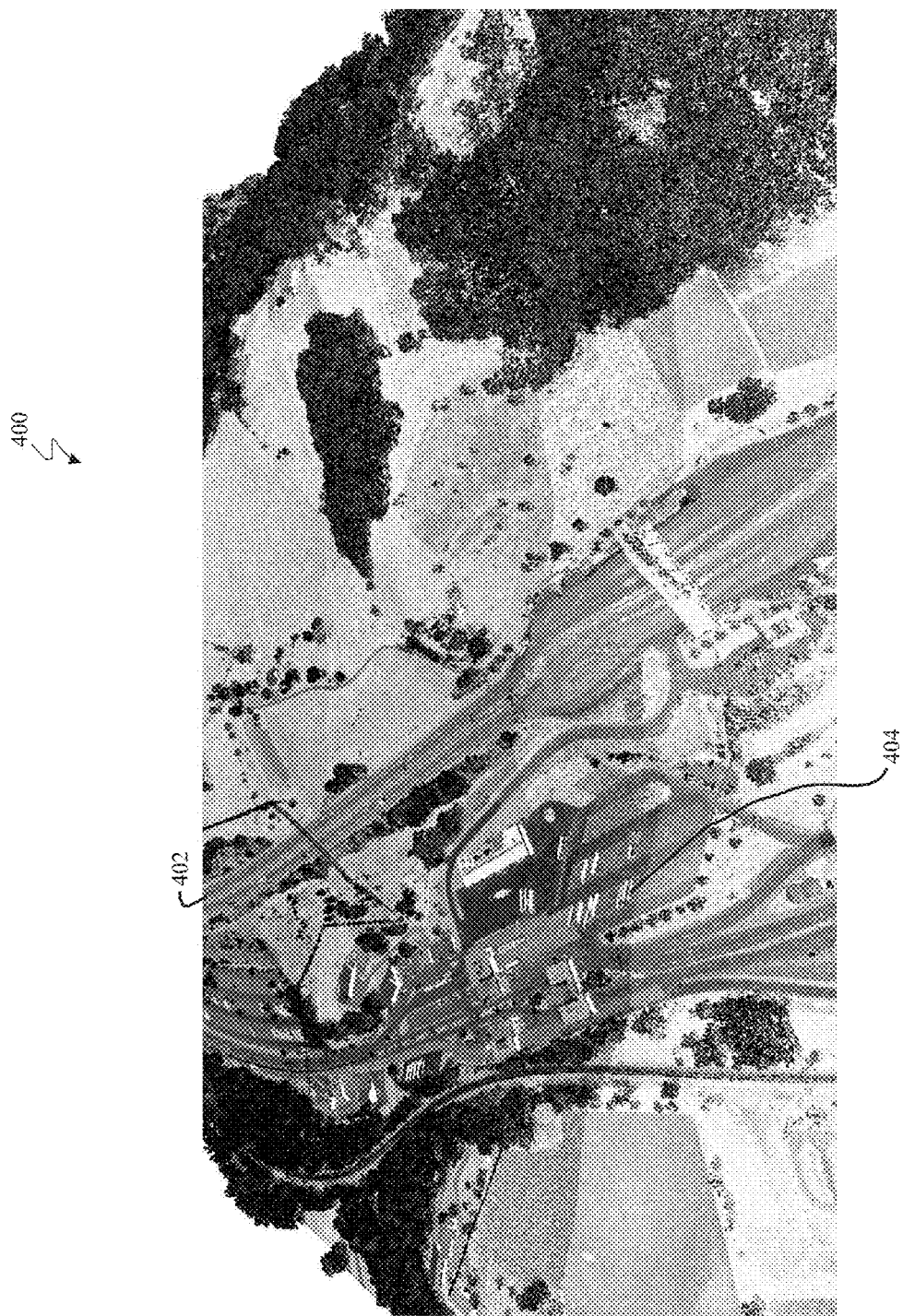

FIGS. 2 to 4 show graphical representations of example datasets 200, 300, 400 gathered by an Airborne LiDAR system such as depicted in FIG. 1. These three example datasets 200, 300, 400 include several tens of millions of data points where each data point is associated with a physical point in space. As will be discussed in detail below, the datasets 200, 300, 400 may be compressed using embodiments of the presented invention. Data points in LiDAR datasets 200, 300, 400 may describe a large variety of features or objects on the Earth's surface. For example, in FIG. 2 a dataset 200 representative of a hilly terrain is shown including elements such as roads 202, houses 204, individual trees 206, and forest 208. In FIG. 3, an example dataset 300 is graphically depicted that represents an urban area including power lines 302. In FIG. 4, another example dataset 400 is graphically depicted that represents an area of land including a highway 402 with various vehicles 404. Unless specifically stated otherwise, throughout the present description these and similar natural or artificial features represented in the example LiDAR datasets will be referred to as "objects".

Figure 5:
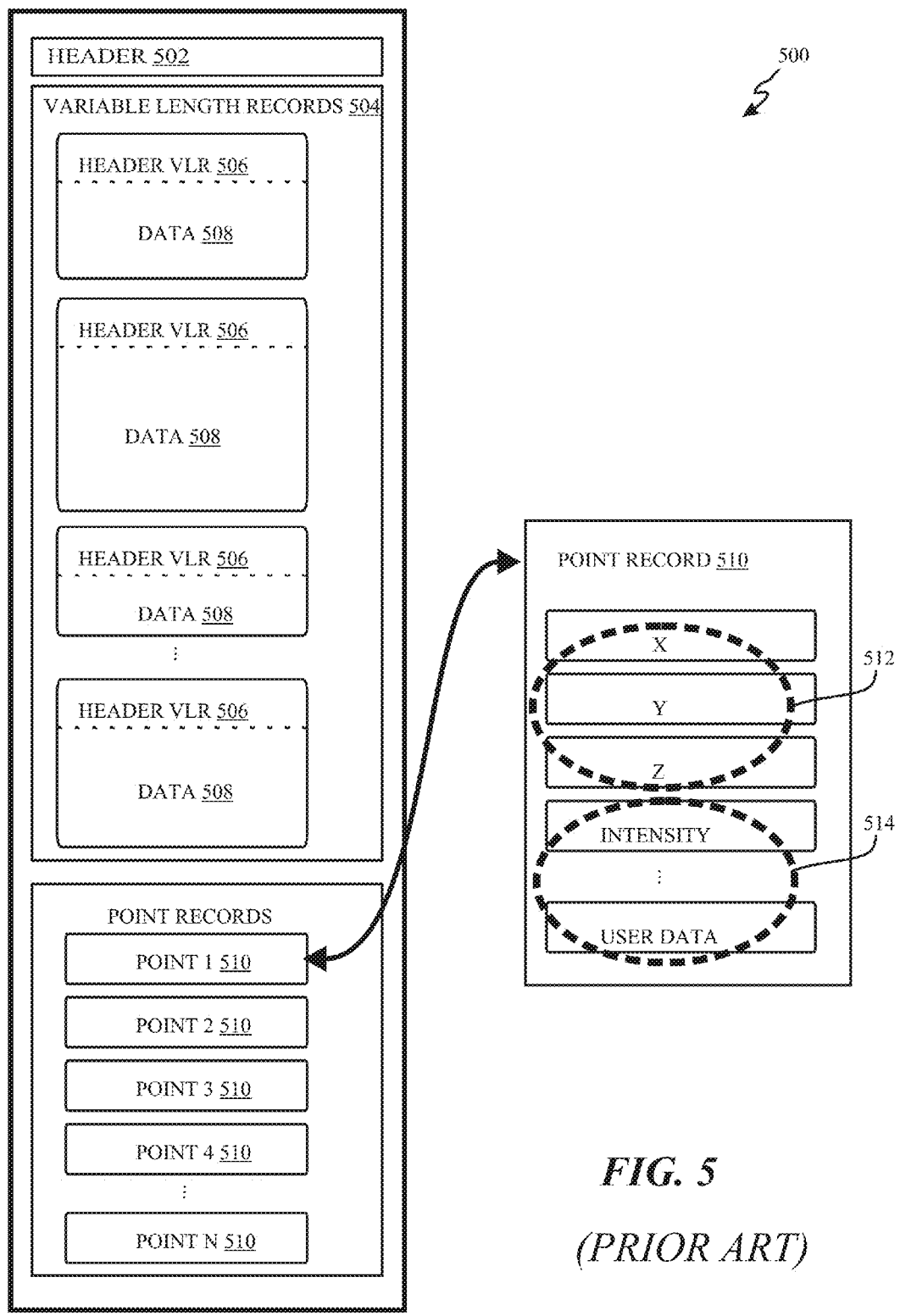
FIG. 5 is a block diagram depicting the structure of a standard LAS file format according to the prior art.

LiDAR datasets are typically stored in the LAS file format 500 which is an open (non-proprietary) binary file format with a structure illustrated in FIG. 5. Information regarding the dataset is stored in the file header 502. This information may include the version of the LAS file format, the number of points contained in the dataset and the coordinate bounds. In total, 227 bytes are used for the file header 502. Additional information about the dataset may be stored in the form of one or more variable length records (VLR) 504 that follow the file header 502. Because VLR data may be of arbitrary size and may be arbitrarily added or removed from the archive, each VRL 504 includes a VRL header 506 for the associated VLR data 508. However, the majority of the LAS file format 500 is used for point records 510 where actual data regarding recorded points is stored.

Although slight differences between different revisions of the LAS file format 500 exist, points have consistently been represented in point records 510 by xyz-coordinates 512 and with associated scalar values 514. Coordinates are represented by integer values and therefore, 12 bytes are used to store them. Scalar values represent additional information about the point such as intensity, GPS time, and user specific data. Scalar values are therefore of different types, however, the scalar values are represented by no more than 8 bytes per value. In summary, up to 34 bytes are used to store a single data point in the LAS file format 500 version 1.2.

The compression methods of the present invention may be used to greatly reduce the amount of data needed to accurately represent information in a LAS file. For example, the original representation of the dataset 200 shown in FIG. 2 includes 508 megabytes of data. In compressed form according to the present invention, the dataset 200 represented in FIG. 2 can be stored in 68 megabytes. In this manner, the achieved compression ratio is 0.13. Similarly, in the case of the dataset 300 depicted in FIG. 3, the achieved compression ratio is 0.09, and in the case of the dataset 400 depicted in FIG. 4, the compression ratio is 0.1.

Thus, using the apparatus and methods of the present invention, substantially less storage space may be used to archive, e.g., terrain information. For example, a LiDAR data provider typically distributes LiDAR data to consumers on a compact disc (CD) or digital versatile disc (DVD). Rather than storing the data in the form of LAS files that may require several CDs or DVDs, the compression apparatus and methods of the present invention may be used to reduce the number of discs required and thus, reduce the expense of storing the data. Likewise, the consumer can decompress the data using the apparatus and methods of the present invention without any loss and view it or use it for further processing.

Additionally, the apparatus and methods of the present invention may be used to rapidly compress large datasets to reduce the time of data transmission over private or public networks. For example, two computing devices may be components of a distributed computing system. To transmit the data from the first computing device to the second one, the first computing device may compress the data, and send it to the second computing device in the compressed format. The second computing device may then store the data in the compressed format or it may decompress the data for further processing.

Figure 6:
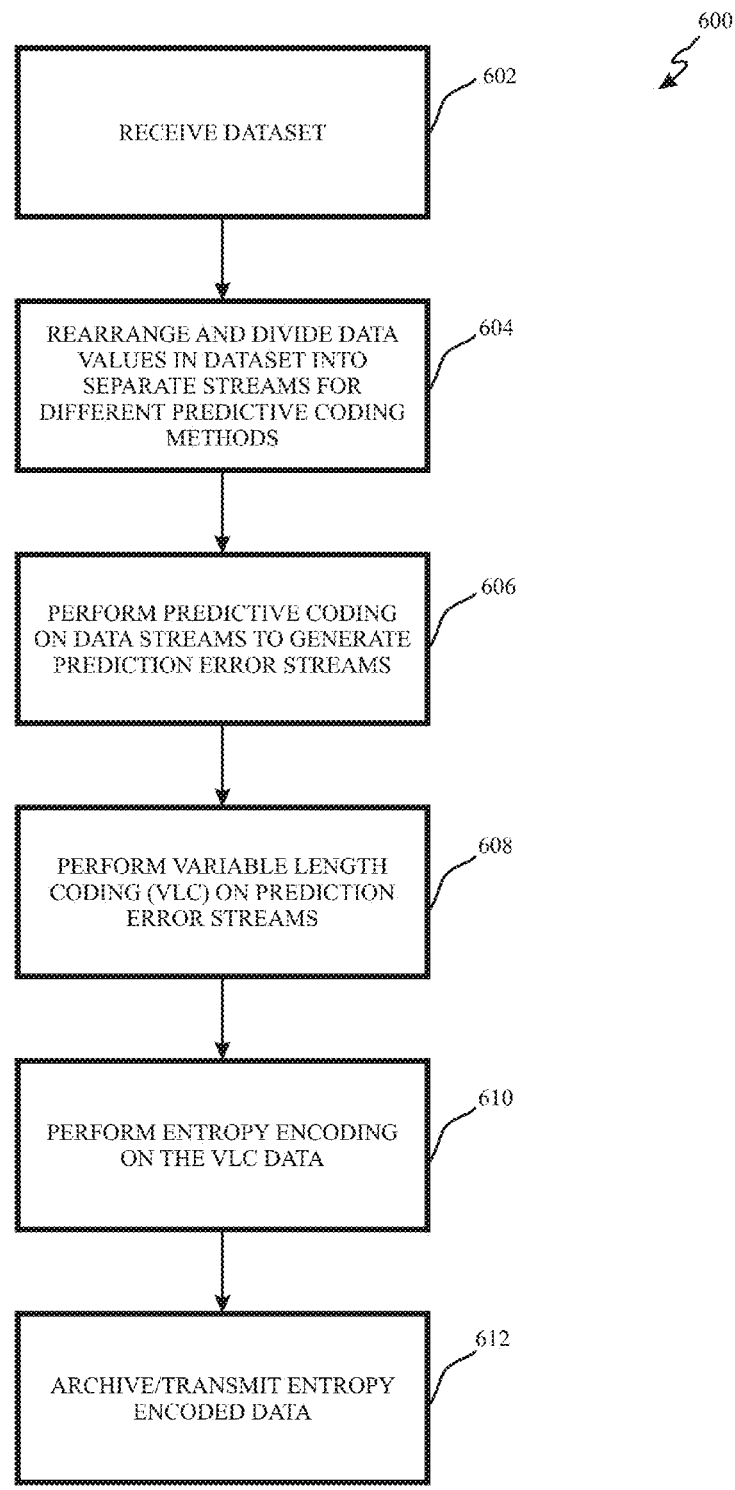
FIG. 6 is a flowchart depicting an example embodiment of methods in accordance with the present invention.

Turning now to FIG. 6, a flowchart illustrating an example method 600 embodiment of the present invention is provided. The method 600 may be implemented as software instructions executable on a general purpose computer or processor. In some embodiments, the method 600 or any part thereof may be implemented in hardware (e.g., as an electronic circuit, in a programmable logic array, etc.) or as firmware instructions for an embedded controller. Any practicable hardware or software implementation of the method may be used. Further, although a specific number and order of method steps are described in the example method 600, it should be understood that any number or combination of sub and/or super steps in any practicable order may used to implement the method 600.

The method 600 begins at Step 602 wherein a dataset including numerous data points representative of position data and associated scalar data is received. The dataset may be received in the form of a file, as a continuous flow of data, or via any practicable transmission or delivery method. The incoming dataset may be received in the LAS file format or in some embodiments, in any other practicable format.

In Step 604, the data in the dataset is rearranged and divided into a series of independent streams, wherein an association is maintained between attribute records related to a given data point. In other words, the system executing the method 600 is able to correlate the data in one stream with the corresponding data in each other stream. This allows subsequent steps to be performed in parallel over each of the streams of values. Note that as used herein, the term "stream" may refer to any sequential string of data and that the terms stream, string, and sequence are intended to be synonymous unless otherwise indicated. In some embodiments, the association between attribute records may be maintained simply by maintaining the original order of the data and using a counter to index the attribute records in the data streams such that, for example, the nth record in the first data stream corresponds with the nth record in the second data stream, etc. In alternative embodiments, processing of the attribute records in the different data streams may be synchronized with each other via a clock such that corresponding records are processed concurrently.

In alternative embodiments of the invention, parallel processing the data streams may not be used and the step of rearranging the data may be omitted in such cases. However, when predictive coding of at least one data stream that uses information from other data streams is employed (e.g., when y values are determined based on x values), the data streams used in the predictive coding rules may not be processed completely independent from other data streams and therefore, correlation or synchronization between data streams facilitates parallel processing.

The streams of values are encoded by predictive coding in Step 606 where values are encoded in terms of prediction errors or differences between actual values and predicted values. Because the absolute values of prediction errors are much smaller than original values and may frequently be zero, these values can be represented more efficiently than the original values.

To take advantage of this efficiency, variable length coding (VLC) is applied to the generated prediction errors in Step 608. In Step 610, the redundancy within the variable length codes from Step 608 is removed by applying an entropy encoding algorithm (e.g., arithmetic coding) to the variable length codes. The output stream from application of the entropy encoding algorithm may then be stored in an archive file in Step 612 and/or may alternatively be transmitted over a network.

Figure 7:
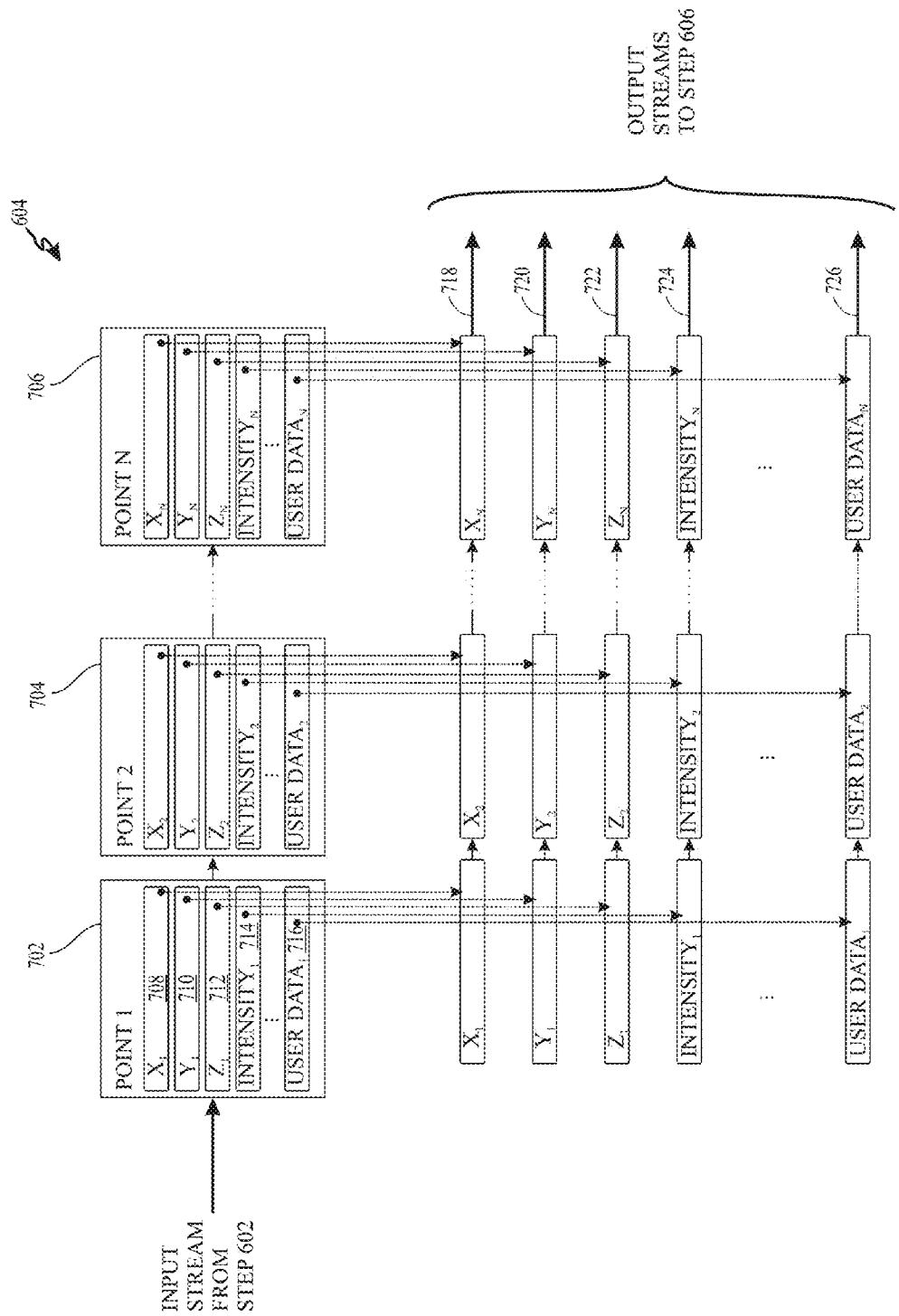
FIG. 7 is a functional block diagram of point attribute rearrangement according to example embodiments of the methods of the present invention.

Turning now to FIG. 7, details of an example embodiments of the methods of Step 604 are provided. Specifically, the rearrangement and division of data point attributes into separate streams of values is explained in detail. The input data from Step 602 is represented as a stream of data point records 702, 704, 706, as may be found in an LAS dataset, although any other practicable form of representation (e.g., a static array) may be employed. For each point record attribute 708, 710, 712, 714, 716, a corresponding stream 718, 720, 722, 724, 726 may be created. Thus, an X data stream 718, a Y data stream 720, a Z data stream 722, an Intensity data stream 724, any number of other data streams corresponding to additional scalar attribute values, and a User data stream 726 may be generated from the N point records 702, 704, 706. Note that the attribute values beyond the positional attributes 708, 710, 712 (i.e., X, Y, Z) are optional and may or may not be included. The attribute values 708, 710, 712, 714, 716 are then relocated from data point records 702, 704, 706 to the corresponding stream 718, 720, 722, 724, 726 where indices of values in the streams 718, 720, 722, 724, 726 match with the indices of the data points to which they correspond. In this manner, the original representation may be reconstructed when the data is later decompressed.

Figure 8:
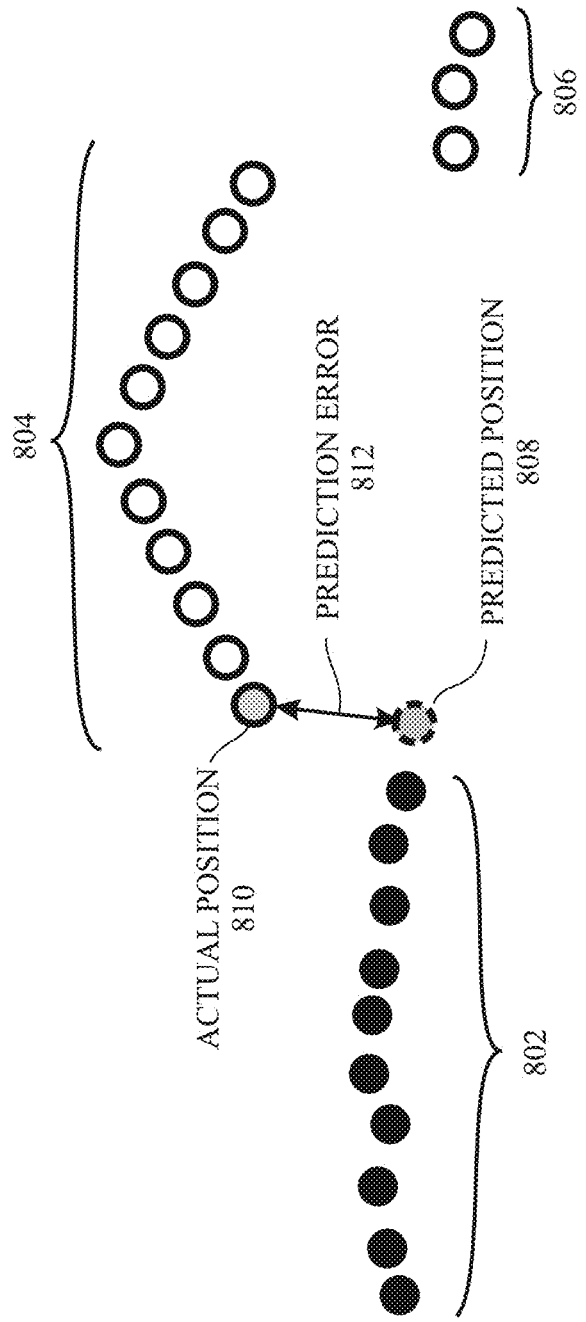
FIG. 8 is schematic diagram of predictive encoding according to example embodiments of the methods of the present invention.

As mentioned above, in order to reduce the absolute values in each of the streams 718, 720, 722, 724, 726, a predictive coding is performed in Step 606 of the example method depicted in FIG. 6. A graphical example 800 of predictive coding is illustrated in FIG. 8. The image in FIG. 8 represents a series of points measured via LiDAR that lie in a line proceeding from left to right across the page. The solid points 802 track the ground leading up to a house represented by the hollow points arranged in a chevron-shape 804 corresponding to the roof line of the house. The hollow points beyond the house to the right 806 track the ground past the house. In predictive coding, based on the history of data points' positions as indicated by the solid points 802, a prediction for the next point's position 808 is made. However, due to the unexpected presence of a house in this example, there is significant difference between the predicted position 808 and the actual position 810 of the next point. In this case, a prediction error 812 is determined and may be defined as follows:

$$e_i = v_i - vp_i$$

where the variable "v" represents the actual value in the stream and "vp" corresponds to the predicted value made for this value v. The prediction error is represented as a variable "e". Since prediction errors are stored in order to reconstruct the actual point positions during the decoding process, in some embodiments, these values may be further processed.

The efficiency of the VLC (Step 608 of FIG. 6) and entropy encoding (Step 610 of FIG. 6) may be dependent on the absolute values of the prediction errors. The following prediction rules may therefore be employed for the different streams 718, 720, 722, 724, 726 of point attributes to achieve high prediction accuracy and to minimize the absolute values of the prediction errors.

Figure 9:
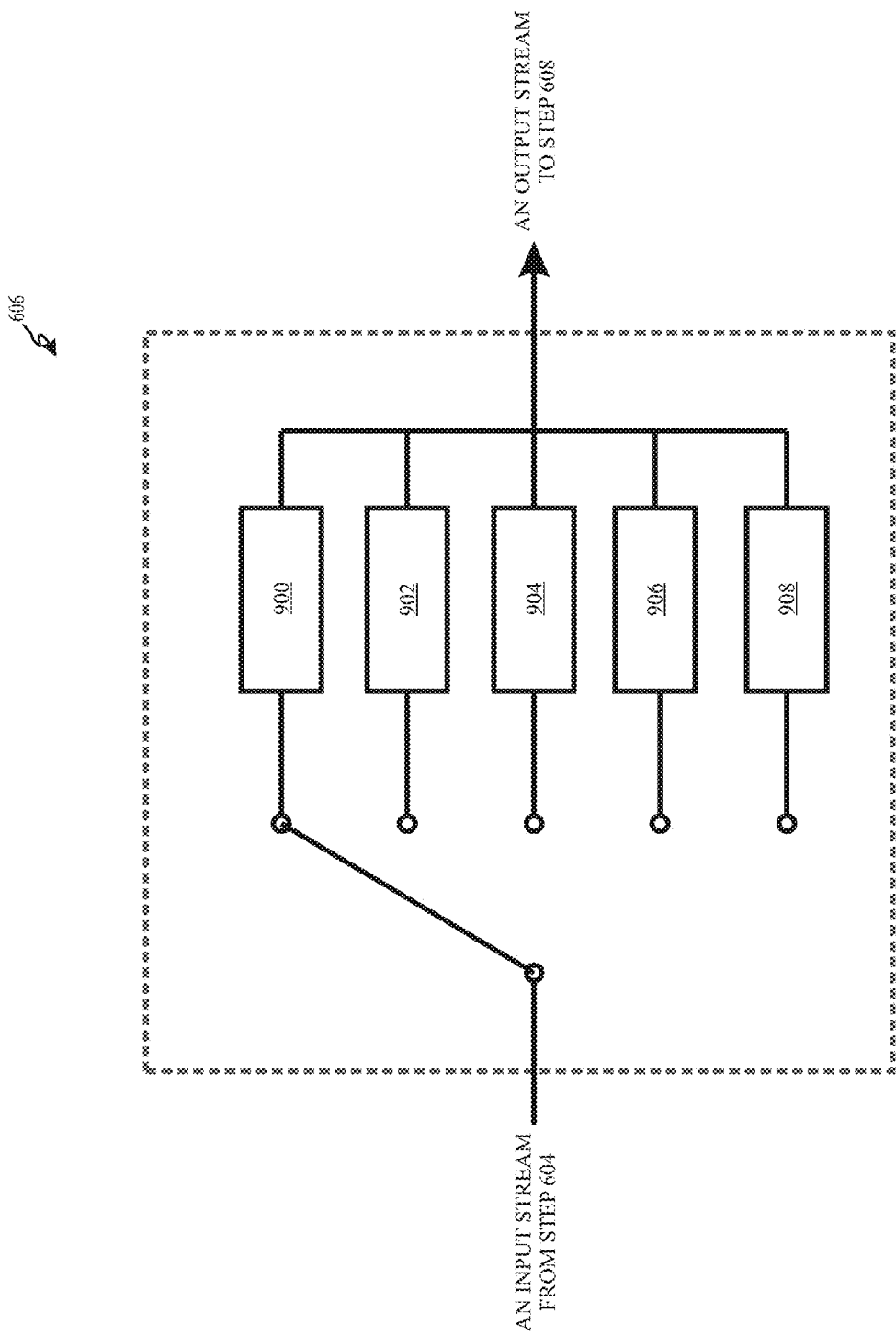
FIG. 9 is a block diagram for applying predictive coding rules according to example embodiments of the methods of the present invention.

Turning to FIG. 9, an example method embodiment of Step 606 of FIG. 6 is illustrated as a multiplex switch adapted to select a suitable prediction rule based upon the particular input stream type provided to the switch. Each input stream 718, 720, 722, 724, 726 from FIG. 7 (and collectively, the output streams of Step 604 from FIG. 6) is encoded using one of the following prediction rules to obtain an output stream of prediction errors:

Constant Prediction Rule (900)
Linear Prediction Rule (902)
Prediction Rule For X-Coordinate (904)
Prediction Rule For Y-Coordinate (906)
Prediction Rule For Z-Coordinate (908)

The constant prediction rule 900 may be selected for use in the prediction schema by default when no special prediction rule for a given stream is prescribed. This prediction rule presumes that the next value in the stream will be the same as the current value and may be formally defined as follows:

$$vp_{i+1} = v_i$$

where the variable "$vp_{i+1}$" represents the next predicted value in the stream and "$v_i$" corresponds to the current value in the stream.

The data points may also include the GPS clock time of their recording as one of the scalar attribute values, which changes for each successive point. However, the GPS time difference between successive points is nearly a constant value. Because of this, linear prediction is suitable for use in this case. The linear prediction rule 902 estimates the next value in the stream based on the linear function of previous samples and may be formally defined as follows:

$$vp_{i+1} = v_i + \sum_{p=i-n}^{i-1} \frac{1}{n}(v_{p+1} - v_p)$$

where the variable "$vp_{i+1}$" represents the next predicted value in the stream, "$v_i$" corresponds to the current value in the stream, "$v_p$" and "$v_{p+1}$" represent previous values in the stream, and the value "n" represents the number of previous samples used to predict the next value. GPS time of point recording, intensity of points, and point colors are examples of scalar attributes suitable to be accurately coded using the linear prediction rule 902. Thus, the linear prediction rule 902 may be selected for use in the prediction schema when these types of attribute streams are to be coded.

In terms of the compression efficiency, coding of the point coordinates according to the methods and apparatus of the present invention may provide the most significant contribution. An intuitive understanding of the theory underling the prediction rules for point coordinates is now provided with reference to the FIG. 10. A LiDAR scanner 102 may be carried by an airborne platform 104 from which data points are recorded. The position of the airborne platform 104 continuously changes depending on the flight path 1002 of the airborne platform 104 while the LiDAR scanner 102 itself constantly changes the scan angle 1004. Because data points may be recorded with a high sampling frequency (e.g., over 200,000 Hz) from a relatively large distance (e.g., over 1200 m) with a relatively small scan angle (e.g., less than 30 degrees), the distribution of points may be near to a regular distribution (e.g., points 1006, 1008 and 1010). However, an irregularity in the point distribution may be caused by an object 1012 (e.g., a tree) because point 1014 is gathered from the object 1012, while point 1016 is recorded behind the object 1012.

Figure 10:
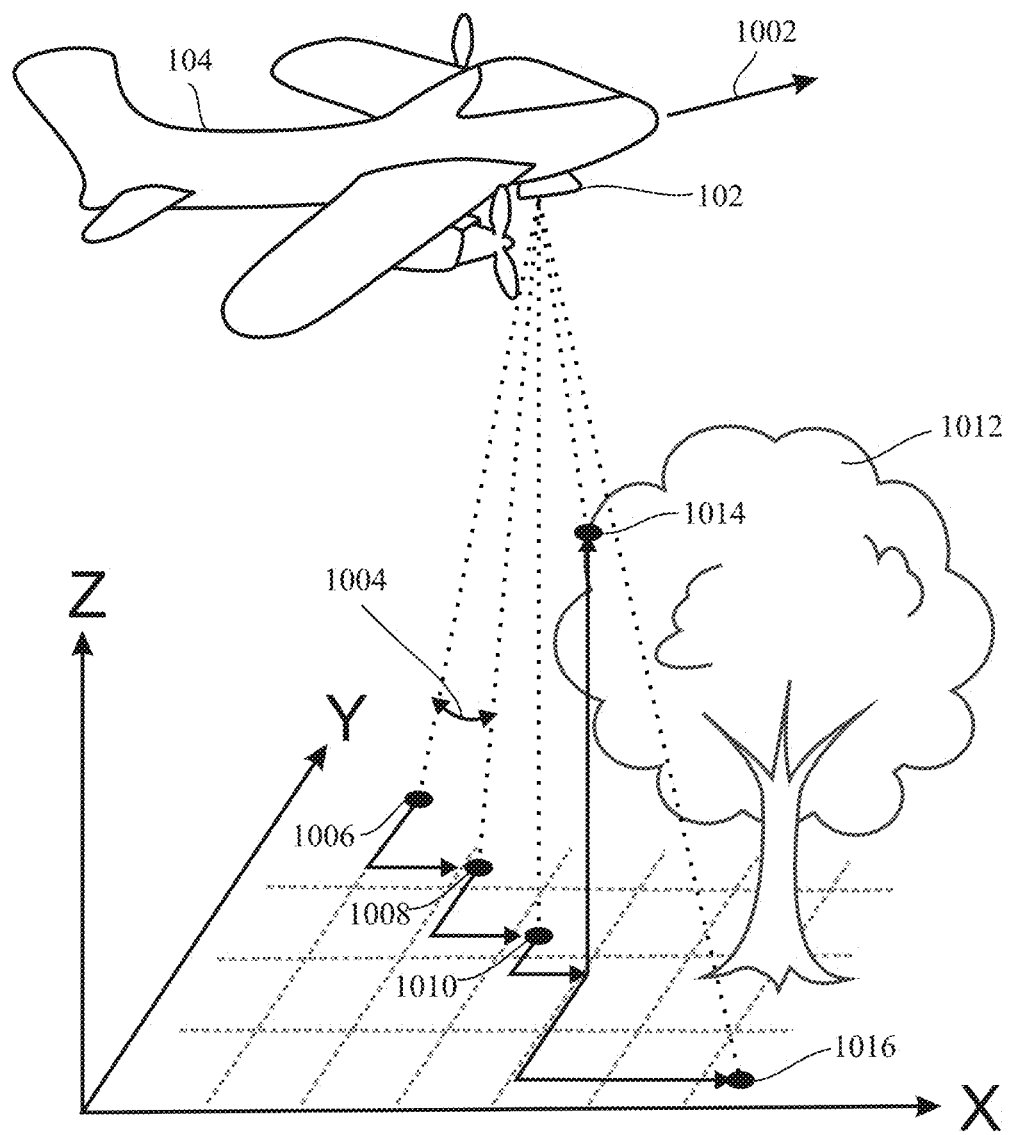
FIGS. 10 and 11 are schematic diagrams explaining the underlying theory of the prediction rules for coding point positions according to example embodiments of the methods of the present invention.

By observing the irregularity in the example point distribution of FIG. 10, one may conclude that the distance between the points in the x-direction implies a directly proportional distance in the y-direction and a directly or an inversely proportional distance in the z-direction. The scanning direction determines whether a correlation between distances in the x-direction and the z-direction is directly or inversely proportional. If the points are recorded in a sequence 1006, 1008, 1010, 1014, and 1016, the illustrated correlation is inversely proportional. This correlation is exploited to estimate predictions.

Figure 11:
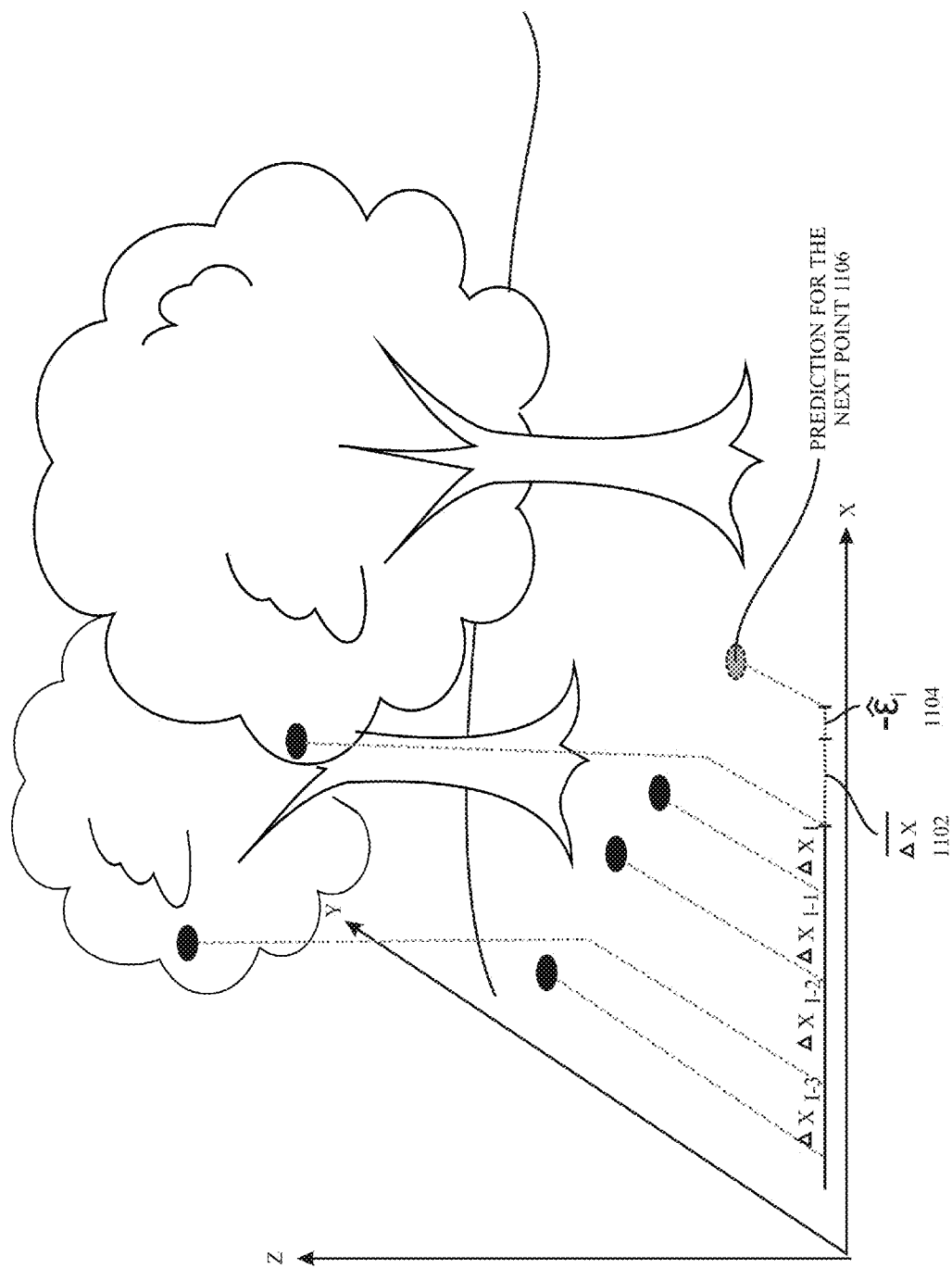

Turning back to FIG. 9, the X-Coordinate prediction rule 904 is selected for use in the prediction schema when a stream of x-coordinates is to be encoded. Referring to FIG. 11, the mean distance between previous samples 1102, 1104 may be used to predict the x-coordinate of the next point 1106. However, the given example in FIG. 11 suggests that a large standard deviation in the data can appear, indicating objects on the surface.

In this case, the values are far from the mean, and an inaccurate prediction would be made by using linear prediction. To reduce prediction errors, a residual of the previous sample 1104 is subtracted from the mean distance when standard deviation becomes greater than a predefined value "δ".

In the example depicted in FIG. 11, the residual of the previous point is negative and the predicted distance is therefore larger than the mean distance. By representing the standard deviation as variable "d", the prediction made for the next x-coordinate as variable "$xp_{i+1}$", and the residual of the previous sample represented as variable "$\hat{\epsilon}_i$", the prediction rule for x-coordinate may be formally defined as follows:

$$x'_{i+1} = \begin{pmatrix} x_i + \sum_{k=i-n}^{i-1} \frac{1}{n}(X_{k+1} - x_k); & d < \delta \\ x_i - \hat{\epsilon}_i + \sum_{k=i-n}^{i-1} \frac{1}{n}(x_{k+1} - x_k); & d \geq \delta \end{pmatrix}$$

$$\hat{\epsilon}_i = x_i - \sum_{k=i-n}^{i-1} \frac{1}{n}(x_{k+1} - x_k)$$

Turning back to FIG. 9, the Y-Coordinate prediction rule 906 is selected for use in the prediction schema when a stream of y-coordinates is to be encoded. Referring once again to FIG. 10, because the distances between points in x-direction "$\Delta x$" are directly proportional to the distances between points in the y-direction "$\Delta y$", a prediction for y-coordinate "$yp_{i+1}$" may be estimated based on "$\Delta x$". Thus, the method searches among the last "n" samples for a pair of successive points separated by a distance in the x-direction "$\Delta x_k$" similar to the considered distance "$\Delta x_i$". In other words, the method searches for prior successive points where $\Delta x_k \doteq \Delta x_i$. In some embodiments, a mapping table may be used to search the historical x-distances. If successive points where $\Delta x_k \doteq \Delta x_i$ is found in the mapping table, the corresponding distance in y-direction "$\Delta y_k$" is used as the predicted value for the next y-coordinate "$yp_{i+1}$". Otherwise, a linear interpolation function of distance between the previous two samples may be used. By representing the coefficient of a linear interpolation function as "$K_x$", the prediction rule for y-coordinates may be formally defined as follows:

$$yp_{i+1} = \begin{pmatrix} y_i + \Delta y_k; & \Delta x_k \doteq \Delta x_i \ \& \ i-n < k \leq i \\ y_i + k_x * (\Delta x_{i+1} - \Delta x_i); & \text{else} \end{pmatrix}$$

$$K_x = \left(\frac{\Delta y_i - \Delta y_{i-1}}{\Delta x_i - \Delta x_{i-1}}\right), \Delta x_i = x_i - x_{i-1}, \Delta y_i = y_i - y_{i-1}$$

Turning back to FIG. 9, the Z-Coordinate prediction rule 908 is selected for use in the prediction schema when a stream of z-coordinates is to be encoded. Referring once again to FIG. 10, the stream of z-coordinates is encoded based on a similar principle as used to encode the y-coordinates. Since distances in the z-direction "$\Delta z$" can be directly or inversely proportional to the distances in the x-direction "$\Delta x$", distances in the y-direction "$\Delta y$" are also used. According to embodiments of the present invention, the last "n" samples are searched for a pair of successive points with distances in x- and y-directions similar to the current pair of points. In other words, the method searches for prior successive points where $(\Delta x_k, \Delta y_k) \doteq (\Delta x_i, \Delta y_i)$. If such a pair of points is found, the corresponding distance in the z-direction "$\Delta z_k$" is used to predict the next z-coordinate "$zp_{i+1}$". Otherwise, a linear interpolation function of the distance between the previous two samples is used. Because the interpolation can be made either on the x- or the y-coordinates, the error of the interpolation functions ("$error_x$" and "$error_y$") is measured using previous samples, and the more accurate one is used. The prediction rule for z-coordinate may be formally defined as follows:

$$zp_{i+1} = \begin{pmatrix} z_i + z_k; & (\Delta x_k, \Delta y_k) \doteq (\Delta x_i, \Delta y_i) \ \& \\ & i - n < k \leq i \\ z_i + K_x * (\Delta x_{i+1} - \Delta x_i); & error_x \leq error_y \\ z_1 + K_y * (\Delta y_{i+1} - \Delta y_i); & error_x > error_y \end{pmatrix}$$

$$K_x = \left(\frac{\Delta z_i - \Delta z_{i-1}}{\Delta x_i - \Delta x_{i-1}}\right),$$

$$K_y = \left(\frac{\Delta z_i - \Delta z_{i-1}}{\Delta y_i - \Delta y_{i-1}}\right),$$

$$\Delta x_i = x_i - x_{i-1},$$

$$\Delta y_i = y_i y_{i-1},$$

$$\Delta z_i = z_i - z_{i-1}$$

Note that predictive decoding is the reverse process of predictive coding, where prediction errors are added to the estimated predictions to reconstruct the original values. To retrieve the original values, the identical prediction rules discussed above may be employed in an identical order. Although each of the scalar streams may or may not be coded in parallel, synchronizing the decoding of position data streams (i.e., the xyz-coordinates) facilitates parallel decoding of position data. To ensure accurate decoding, the value "$x_i$" is decoded before the prediction value "$yp_i$" is determined and the values "$x_i$" and "$y_i$" are determined before the prediction "$zp_i$" is calculated.

Referring back to the flowchart of FIG. 6, the above-described prediction rules are employed in Step 606 to transform the input streams of values into the output streams of prediction errors. The streams of prediction errors are further encoded by variable length coding (VLC) in Step 608.

VLC may be applied to the streams of prediction errors for a number of reasons. With predictive coding according to the present invention, the absolute values of the data representing the point coordinates and the associated scalar attributes are decreased. Consequently, the representation of values by fixed-length codes (e.g., integer data type) contains a substantial number of zero-bytes. Since zero-bytes do not carry any important information about the values, they are appropriately removed by VLC. However, the redundancy of the values in the streams is increased by VLC. Since entropy encoding algorithms (e.g., arithmetic coding, Huffman, etc.) compress data by removing redundancy, a higher compression efficiency is achieved when the data is processed in Step 610 of FIG. 6. In some embodiments, each of the streams is processed by VLC schema in parallel with the other streams. In alternative embodiments, the streams may be processed by VLC sequentially.

Figure 12:
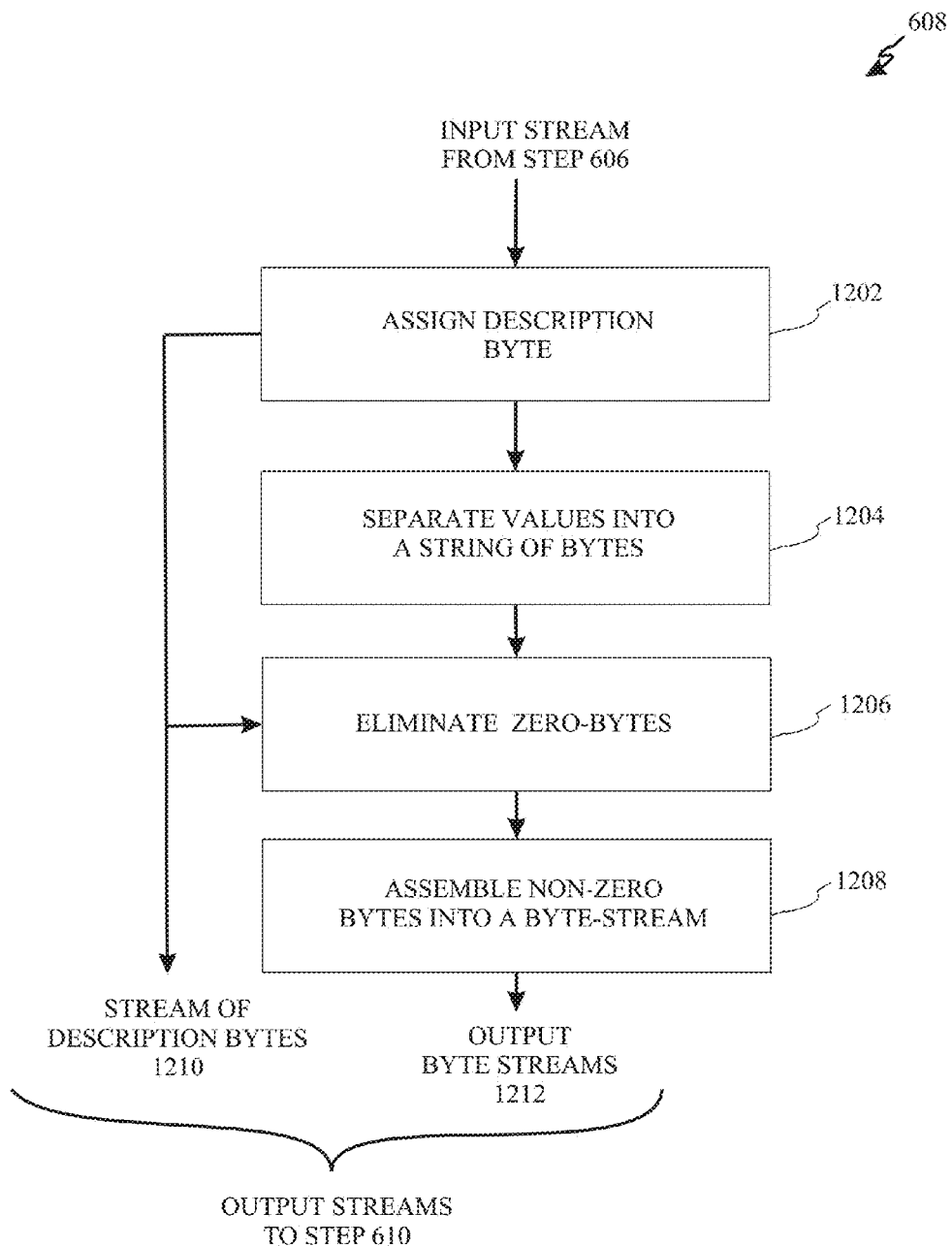
FIG. 12 is a block diagram illustrating variable length coding (VLC) according to example embodiments of the methods of the present invention.

Turning now to FIG. 12, a flowchart depicting an example method 608 of VLC is provided. The input stream from Step 606 of FIG. 6 is received in Step 1202. A description byte is assigned to each value in the input stream. The description byte contains information about the size and the sign of the associated value. Using this information, the values are encoded and decoded. In some embodiments, the description bytes are arranged into an independent stream in order to be processed in parallel with other streams in Step 610 of FIG. 6.

After the description bytes are formed in Step 1202, the values in the input stream are separated into strings of bytes in Step 1204. In Step 1206, the zero-bytes that do not carry any information about the values are removed from the strings of bytes. The non-zero bytes are assembled into the output streams in Step 1208. Although the following detailed description of example embodiments of Steps 1202, 1204, 1206, and 1208 uses the integer data type to illustrate the methods, it will be appreciated by those of skill in the art that it is also applicable to other numeric data types (e.g., short integer).

Figure 13:
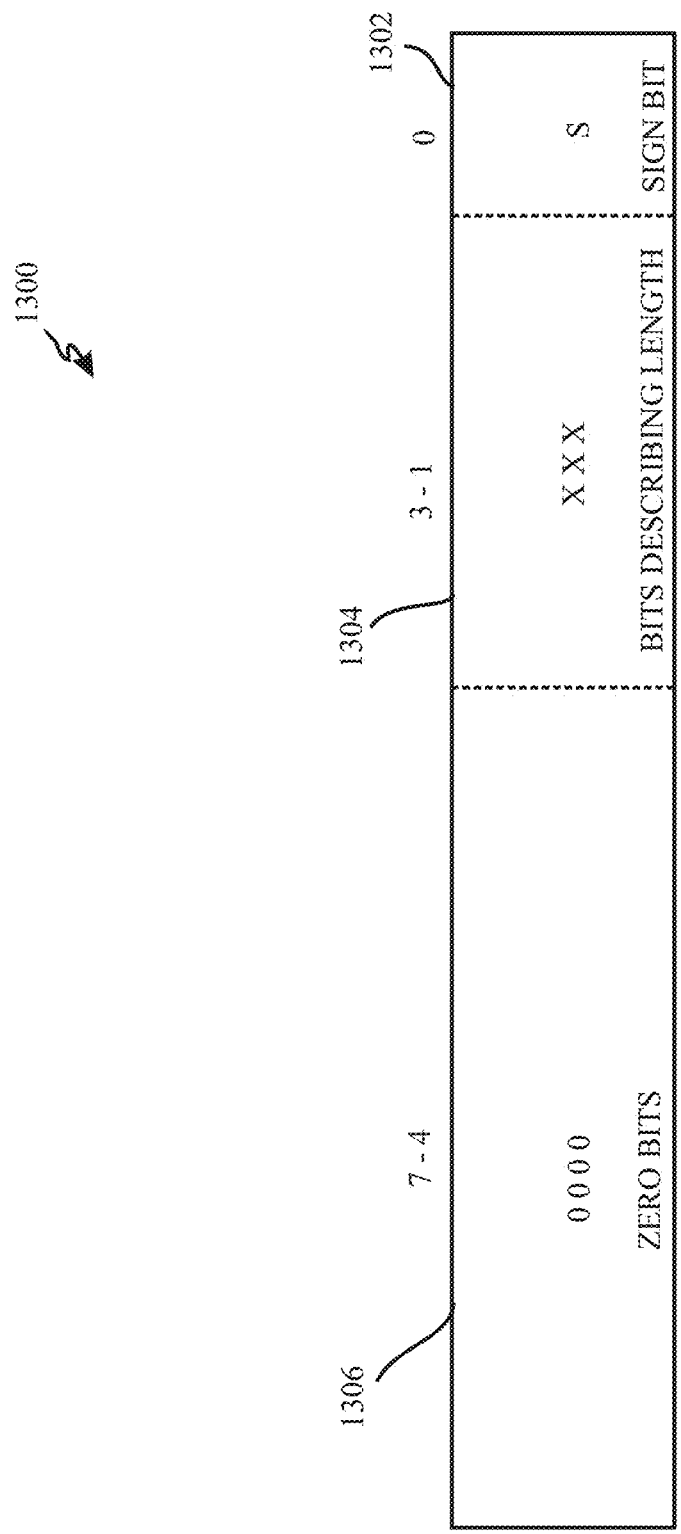
FIG. 13 is a schematic diagram illustrating a description byte assigned to each value according to example embodiments of the methods of the present invention.

A detailed explanation of the description byte 1300 assigned to each value in Step 1202 of FIG. 12 is given in reference to FIG. 13. To increase the redundancy in the input stream, the negative values are represented by sign-magnitude representation rather than by two's compliment. The sign of the associated value is therefore stored in the least significant bit 1302 of the description byte 1300. The next three least significant bits 1304 are used to store size information of the associated value based upon which the number of nonzero-bytes is defined. The four most significant bits 1306 are set to "0" to be easily removed by the entropy encoding algorithm when the stream of the description bytes is processed in Step 610 of FIG. 6. Although a specific arrangement of bits is given, any other practicable arrangement of the bits to store sign and size information may be used in alternative embodiments.

Different embodiments may also be used in constructing the description bytes. In some embodiments, each input value may be tested for the sign and the size separately, and the description byte may be constructed according to each input value at runtime. Alternatively, since the relationship between description bytes and the values is known in advance, the description bytes may be predefined.

Turning now to FIG. 14, the complete relationship of description bytes to values for the integer data type is depicted. For example, if the input value is equal to "0", the sign bit is set to "0" describing the positive value, and the size bits are set to "000" since no actual bytes are needed to represent the absolute value. Thus, the value of the description byte is equal to "0". On the other hand, if the input value is between "1" and "255", the sign bit is set to "0", while the size bits are set to "001" since the absolute value can be represented with one byte. Thus, the value of the associated description byte is equal to "2". Similarly, the value of the description byte is equal to "3" for all the values within the range from "−1" to "−255". In this manner, the description bits are assigned to values quickly by only determining the region to which the considered value belongs (e.g., using predecessor search).

Figure 15:
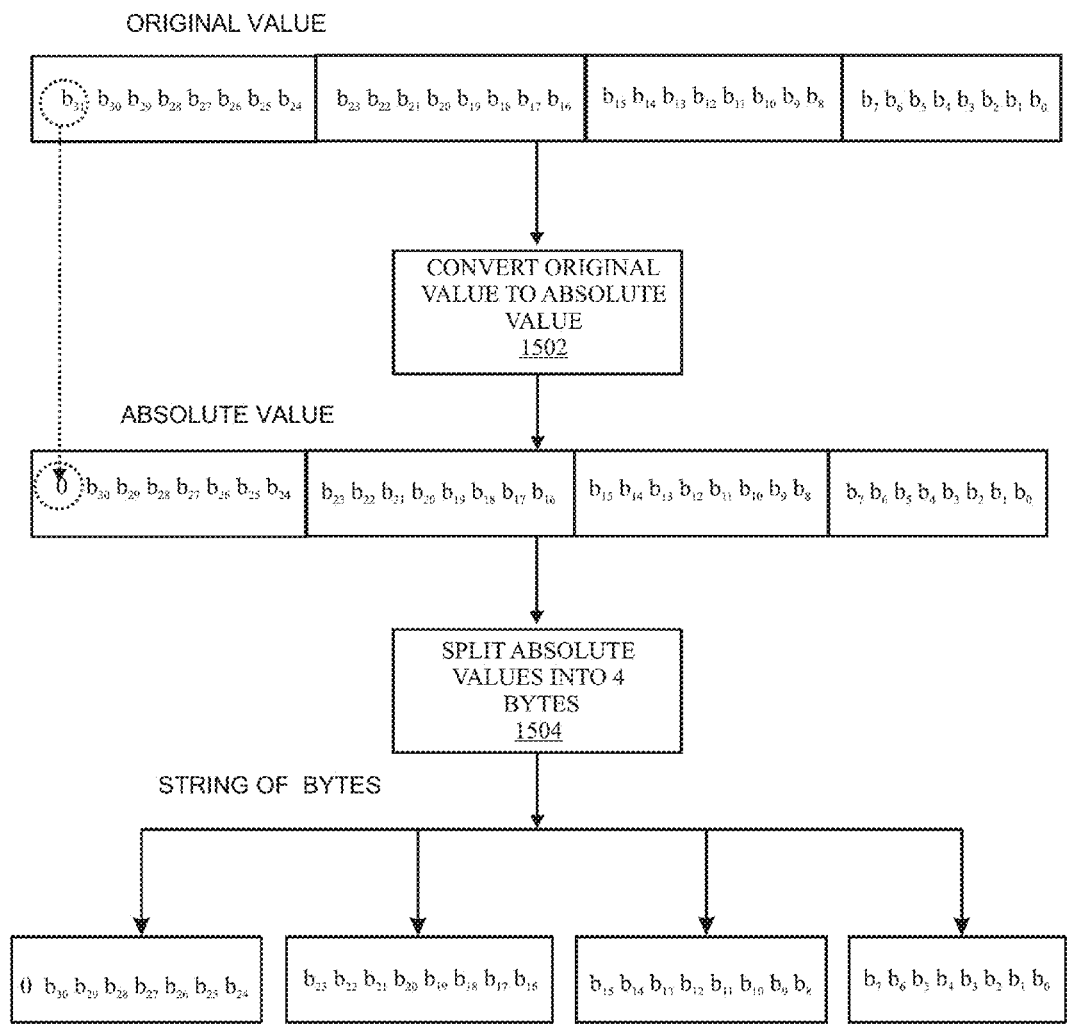
FIG. 15 is a block diagram illustrating separation of values into a string of bytes according to example embodiments of the methods of the present invention.

Step 1204 of FIG. 12, in which the values are separated into strings of bytes, is now described in detail with reference to FIG. 15. Since the sign of the value is already stored in the associated description byte, the input value is converted to the absolute value in Step 1502. The absolute value is then received in Step 1504. Upon receipt of the absolute values, these values are split into a string of four bytes in Step 1504 and output for further processing.

Figure 16:
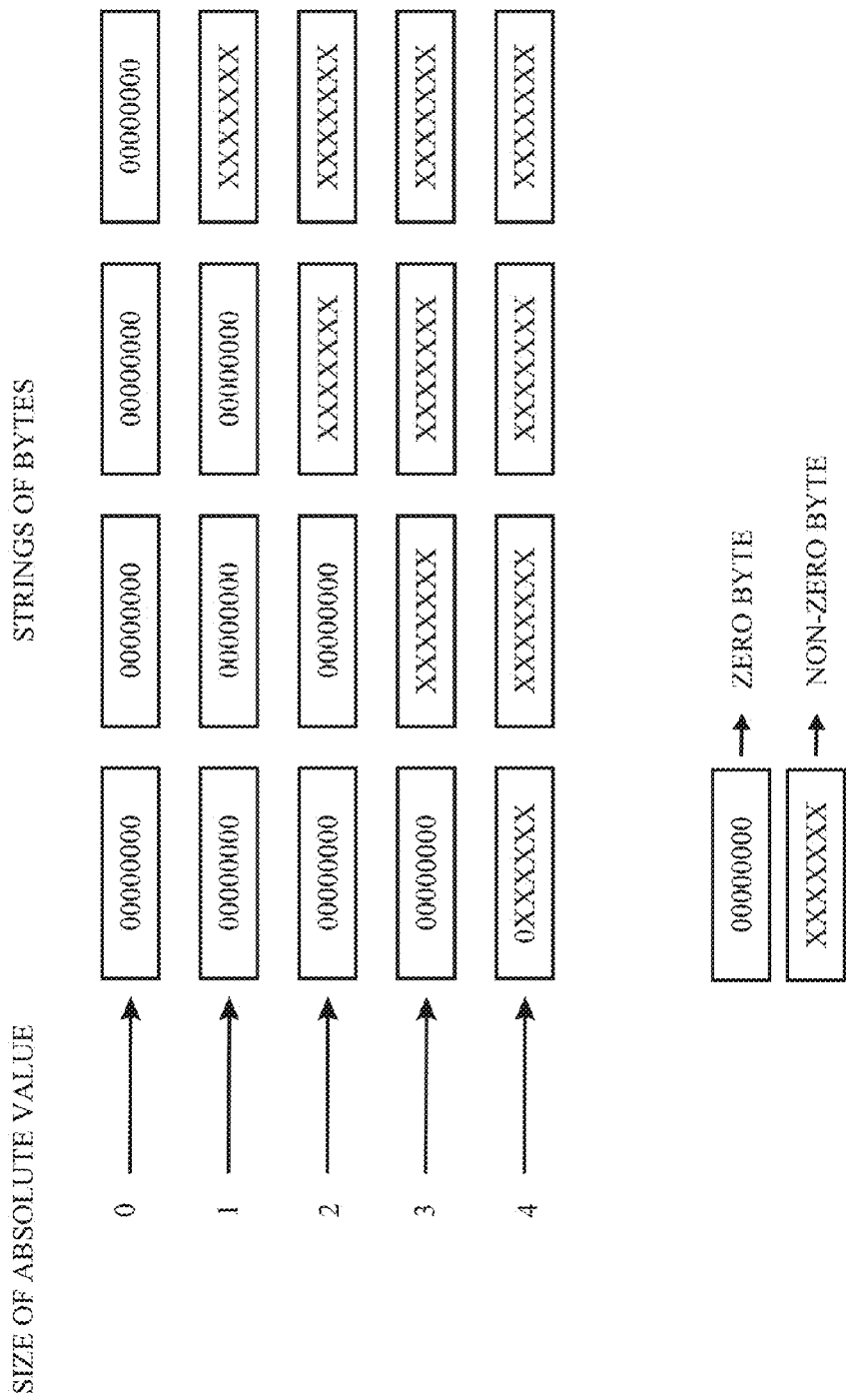
FIG. 16 is a block diagram illustrating zero-bytes removal from strings of bytes based on the size information stored in the associated description byte according to example embodiments of the methods of the present invention.

In Step 1206 of FIG. 12 the string of bytes from Step 1204 is received. Turing to FIG. 16, details of the removal of zero-bytes are provided. According to the size of the absolute value given in the description byte, the number of nonzero-bytes is known. Thus, the complementary number of the most significant bytes is removed since these are zero-bytes. For example, if the size of the input absolute value is equal to "0", all of the bytes representing the value are zero and all bytes are removed. Similarly, if the size of the input absolute value is equal to "1", the information about the actual value is stored only in the least significant byte. Therefore, the three most significant bytes are removed. Likewise for the 2, 3, and 4 absolute value sizes as shown in FIG. 16.

Figure 17:
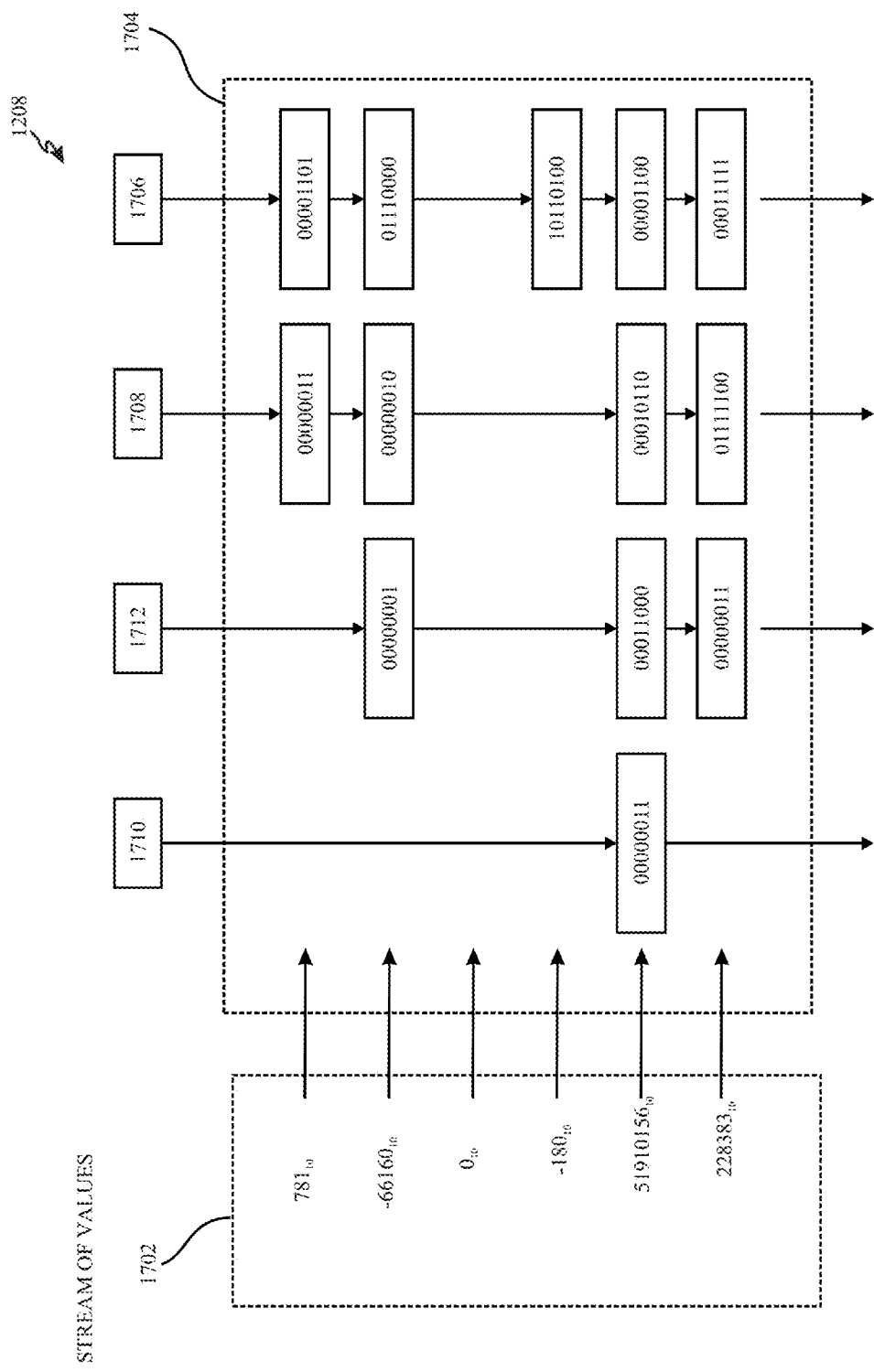
FIG. 17 is a block diagram illustrating forming byte-streams in accordance with the method depicted in FIG. 12 according to example embodiments of the methods of the present invention.

In Step 1208, the remaining nonzero-bytes are assembled into one or more streams. In some embodiments, four independent streams are formed linking together bytes of the same significance. FIG. 17 provides an example which illustrates the details of the formation of the byte streams. An example set of decimal values 1702 are represented as a string of bytes, where the most significant zero-bytes are removed from the stream 1704. All of the least significant bytes are arranged successively into the stream 1706. The first bytes next to the least significant bytes are arranged successively into a stream 1708. Similarly, for the most significant and next to most significant bytes, streams 1710 and 1712 are used. In this manner, increased redundancy in the streams containing the more significant bytes is achieved and the parallel coding of the byte streams may be performed in Step 610 of FIG. 6. In alternative embodiments, the remaining bytes may be successively arranged into one stream, which is compressed by the entropy coding algorithm in Step 610 of FIG. 6.

Turning back to FIG. 6, the output byte streams and associated stream of description bytes from Step 608 are received in Step 610. When receiving the input streams, the entropy encoding algorithm (e.g., arithmetic coding) is applied to each of the input byte streams. In some embodiments, the entropy encoding algorithm is applied to each of the streams in parallel. Alternatively, the input byte streams may be encoded sequentially. In any case, the size of the input byte stream is reduced by removing the redundancy within the byte stream. After the stream is processed in Step 610, the stream may be stored in compressed form in a storage medium or transmitted in compressed form over a network in Step 612.

In some embodiments, when compressed data is stored on the storage medium, a particular order of storing the compressed streams may be used in order to insure the data is decompressed correctly. Alternatively, each stream may be tagged with a code in order to determine the meaning/identity of a given stream at the time the data is to be decompressed. Similarly, when compressed streams are transmitted over a network, the streams may be sent in a particular order or they may be tagged with a particular identifying code.

To decode data that has been encoded using the methods and apparatus of the present invention, a computing device first decodes byte streams using the entropy decoding algorithm. Each of the byte streams may be decompressed in parallel with the others, or in a sequential order. After entropy decoding is applied, the byte streams are employed by a VLC decoder to retrieve the prediction errors.

Figure 18:
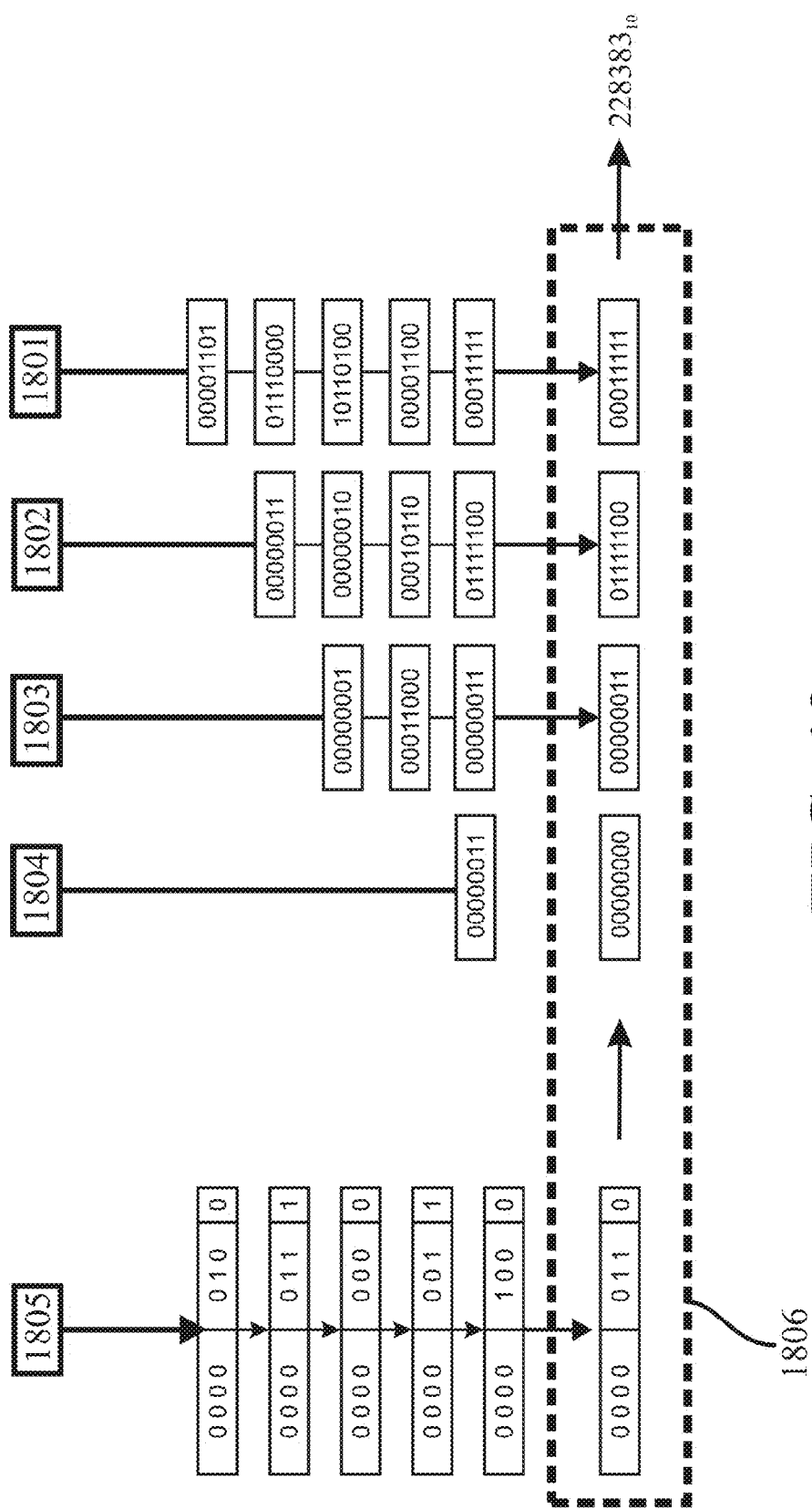
FIGS. 18 to 23 are functional block diagrams illustrating a variable length decoding process according to example embodiments of the methods of the present invention.

Referring now to FIGS. 18 to 23, the decoding of example VLC data is illustrated. In FIG. 18, a VLC decoder 1806 accepts the first description byte in a stream of description bytes 1805. The information describing the size of the associated absolute value defines which bytes from the streams 1801, 1802, 1803, and 1804 are accepted. Since the size of the associated absolute value in the example is equal to three, the first byte from the stream 1801, the first byte from the stream 1802 and the first byte from the stream 1803 are accepted by the VLC decoder and one zero-byte is added to retrieve the integer type representation of the output value.

Figure 19:
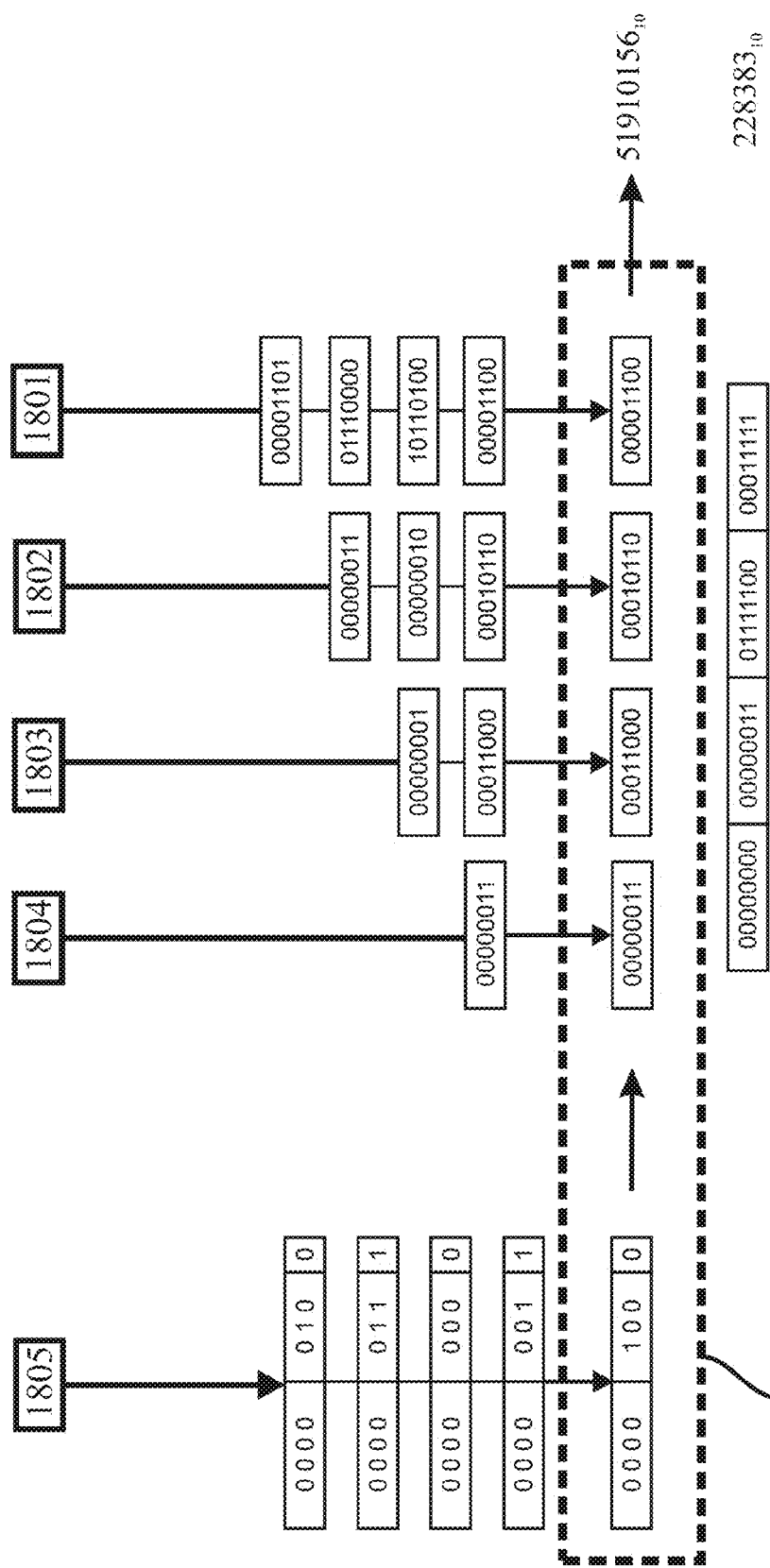

Similarly, as shown in FIG. 19, the next description byte from the stream 1805 is accepted by the VLC decoder 1806. Since the size of the associated absolute value in this example equal to four, the first byte from each stream (1801, 1802, 1803 and 1804) is accepted to form the output number without adding any zero-bytes.

Figure 20:

As illustrated in FIG. 20, the next description byte from stream 1805 is accepted by the VLC decoder 1806. The size of the associated absolute value is equal to one and thus, only the first byte from stream 1801 is accepted by the VLC decoder 1806. Three zero-bytes are initially added to form the absolute value of the integer type. However, since the sign bit of the description byte is set to "1" the output value is negative. Two's compliment is therefore applied to form the output value.

Figure 21:
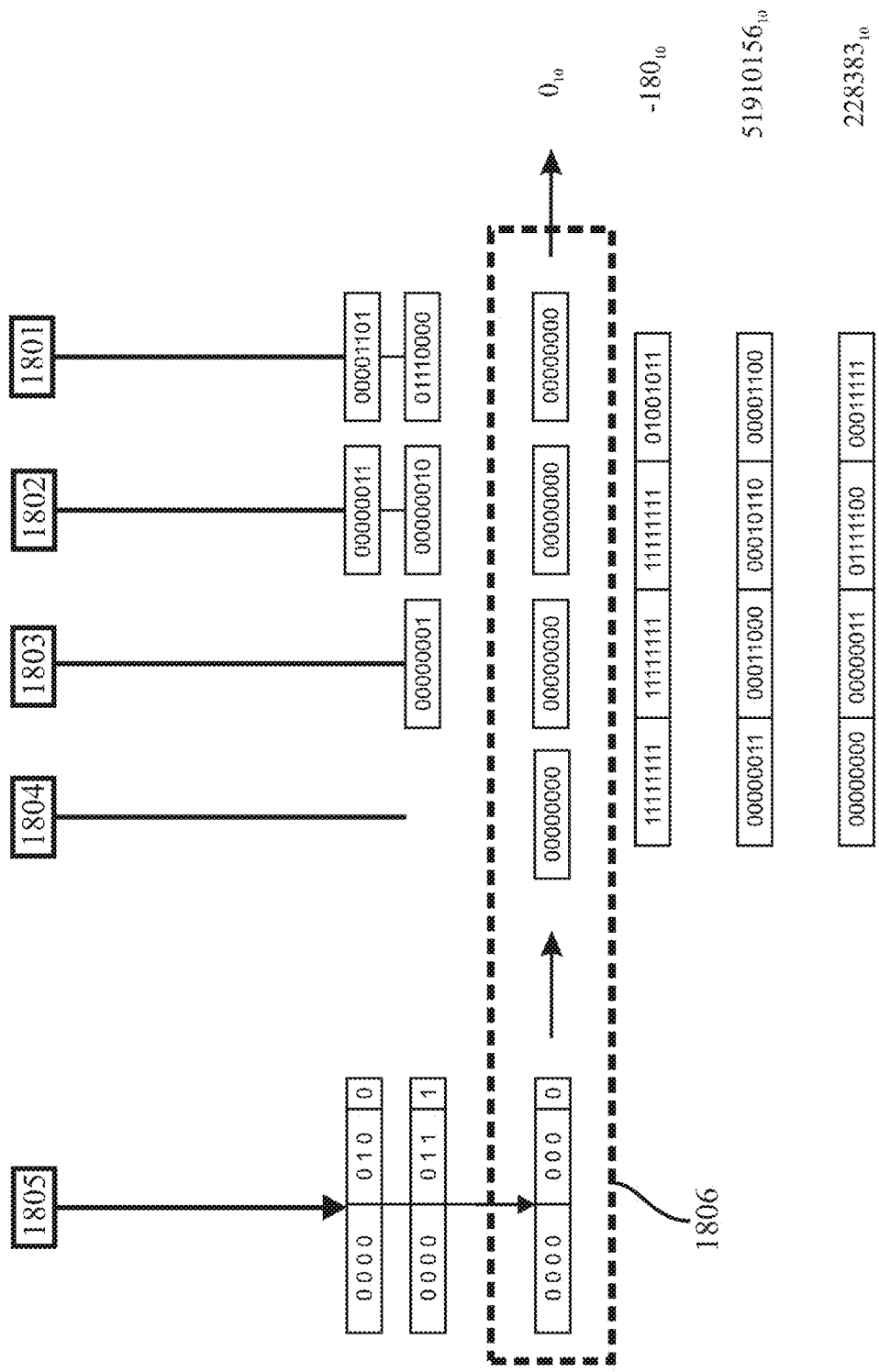

Turning to FIG. 21, the size bits of the accepted description byte are set to zero. Therefore, the output value is zero and no additional bytes from the streams 1801, 1802, 1803 and 1804 are accepted.

Figure 22:
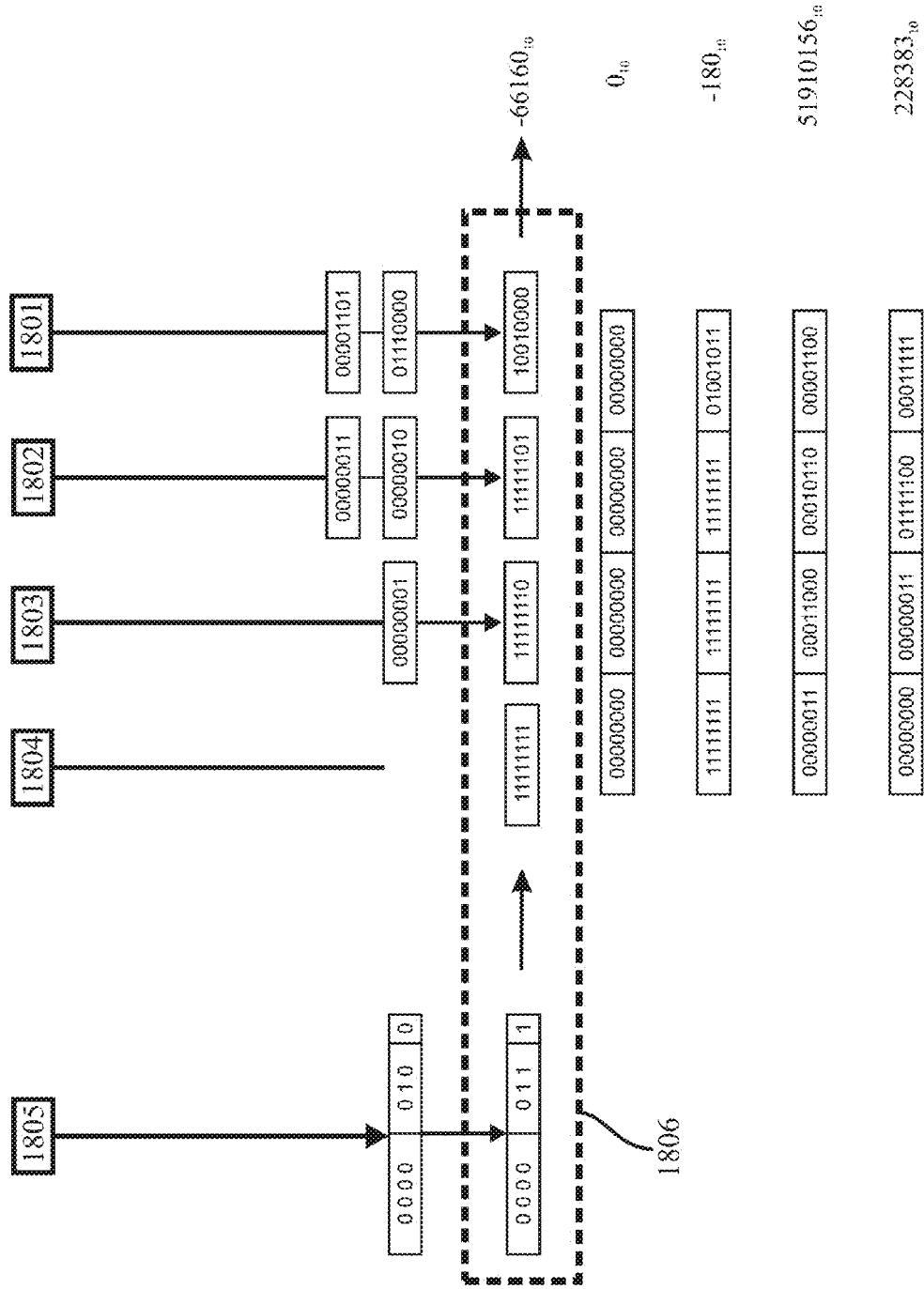

Turning to FIG. 22, the next description byte from stream 1805 is accepted by the VLC decoder 1806. The size of the associated absolute value is equal to three, and the sign bit of the description byte is set to "1". The first bytes from the streams 1801, 1802 and 1803 are therefore accepted by the VLC decoder 1806 and one zero-byte is added to form the absolute value on which the two's compliment is applied to form the output value.

Figure 23:
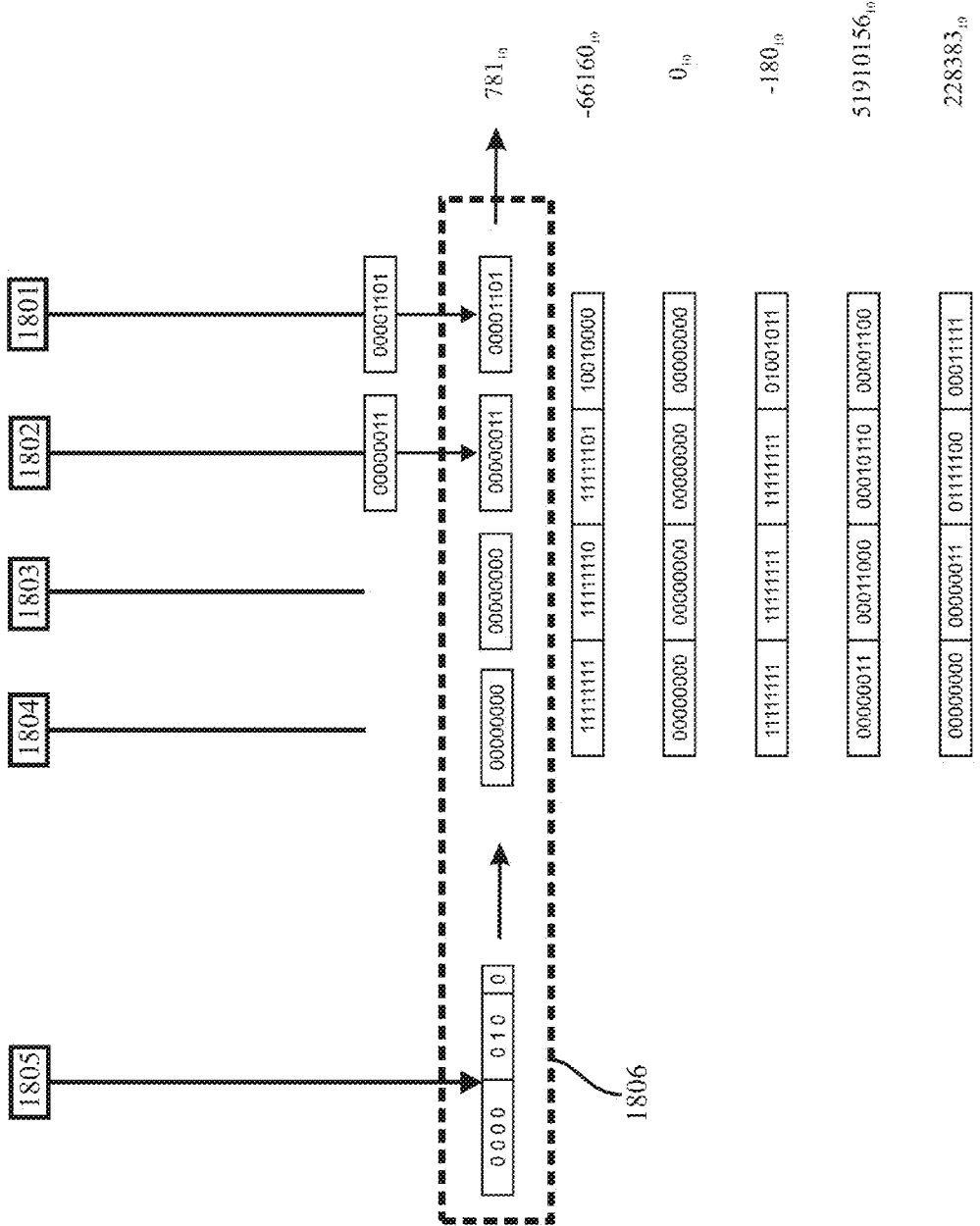

Turning to FIG. 23, the last example description byte from stream 1805 is accepted by the VLC decoder 1806. Since the size of the associated value is equal to two, the bytes from the streams 1801 and 1802 are used to form the output value and two zero-bytes are also added. In this manner the decoding of the stream of values represented by the VLC data is completed, and the prediction errors made in the prediction coding are retrieved.

Predictive decoding as described above may then be applied to restore the original values, which are arranged into the original representation to complete the process of the data decoding.

The foregoing description discloses only exemplary embodiments of the invention and it is intended to be illustrative and not restrictive. Modifications of the above-disclosed apparatus and methods which fall within the scope of the invention will be readily apparent to those of ordinary skill in the art upon reading and understanding the above description. Accordingly, while the present invention has been disclosed in connection with specific exemplary embodiments thereof, the invention is not limited to the embodiments described and it should be understood that other embodiments with modifications and alterations fall within the spirit and scope of the invention, as defined by the appended claims. Therefore, the scope of the invention should be determined with reference to the following claims, along with the full scope of equivalents to which such claims are entitled.

The invention claimed is:

1. A method for compressing three dimensional LiDAR point data, the method comprising:
receiving a dataset to be compressed, the dataset including a plurality of data points in a sequence,
the data points each including at least four types of attribute values,
the attribute value types including an X-coordinate value type, a Y-coordinate value type, a Z-coordinate value type, and at least one associated scalar value type;
applying predictive coding to a sequence of attribute values of a same type from the dataset to generate a sequence of prediction errors for each of the X-coordinate value type and the scalar value type;
applying predictive coding to a sequence of attribute values of a different type from the dataset to generate a sequence of prediction errors for each of the Y-coordinate value type and the Z-coordinate value type;
applying variable length coding to the sequences of prediction errors to generate byte-streams of variable length codes; and
compressing the byte-streams of variable length codes using entropy coding.

2. The method of claim 1, wherein applying predictive coding for the X-coordinate value type and the scalar value type includes:
receiving the sequence of attribute values of the same type;
determining predicted values for each next attribute value in the sequence; and
calculating the sequence of prediction errors based on a difference between corresponding predicted values and attribute values.

3. The method of claim 2, wherein determining predicted values includes:
applying one of a plurality of prediction rules to the sequence of attribute values based upon the type of attribute values to be predicted.

4. The method of claim 3, wherein applying one of a plurality of prediction rules includes:
applying a constant prediction rule where no prediction rule for a given attribute type is prescribed;
applying a linear prediction rule where the attribute value type of the sequence of attribute values includes values that vary linearly;
applying an X prediction rule for x-coordinate value type attribute values;
applying a Y prediction rule for y-coordinate value type attribute values; and
applying a Z prediction rule for z-coordinate value type attribute values.

5. The method of claim 4, wherein applying a linear prediction rule includes applying a linear prediction rule when the attribute values include at least one of GPS recording time of points; intensity of points; and colors of points.

6. The method of claim 4, wherein applying a constant prediction rule includes estimating a prediction for a next value in the sequence of attribute values based on a previous value in the sequence of attribute values.

7. The method of claim 4, wherein applying a linear prediction rule includes estimating a prediction for a next value in the sequence of attribute values based on a linear function of previous values.

8. The method of claim 4, wherein applying the X prediction rule includes:
estimating a prediction for an x-coordinate attribute value of a next data point based on a mean distance between x-coordinate attribute values of previous data points; and
subtracting a residual of a previous x-coordinate attribute value from the mean distance if a standard deviation between previous values is larger than a predefined threshold.

9. The method of claim 4, wherein applying the Y prediction rule includes:
searching the sequence of data points for a first pair of successive data points with x-coordinate attribute values that are a distance apart that is less than a predefined amount different than a distance between a current x-coordinate attribute value and a next x-coordinate attribute value;
determining a prediction for the y-coordinate attribute value of a next data point based on a distance between y-coordinate attribute values of the first pair of successive data points if the first pair of successive data points is found; and determining a prediction for the y-coordinate attribute value of a next data point based on a linear interpolation function of distances between previous data points if the first pair of successive data points is not found.

10. The method of claim 4, wherein applying the Z prediction rule includes:
searching the sequence of data points for a first pair of successive data points with both:
(a) x-coordinate attribute values that are a distance apart that is less than a predefined amount different than a distance between a current x-coordinate attribute value and a next x-coordinate attribute value, and
(b) y-coordinate attribute values that are a distance apart that is less than a predefined amount different than a distance between a current y-coordinate attribute value and a next y-coordinate attribute value
determining a prediction for the z-coordinate attribute value of a next data point based on a distance between z-coordinate attribute values of the first pair of successive data points if the first pair of successive data points is found; and
determining a prediction for the z-coordinate attribute value of a next data point based on a linear interpolation function of distances between previous data points if the first pair of successive data points is not found.

11. The method of claim 1, wherein applying variable length coding to the sequence of prediction errors to generate byte-streams of variable length codes includes:
assigning description bytes to each prediction error in the sequence of prediction errors, wherein each prediction error is represented by bits indicating sign and size;
dividing the description bytes into strings of bytes;
removing zero-bytes from the strings of bytes based on a size of the description bytes; and
assembling remaining non-zero bytes into byte-streams.

12. The method of claim 11, wherein assigning description bytes includes:
storing information indicative of a sign of the prediction error for each prediction error in the sequence of prediction errors; and
storing information indicative of an absolute value of the prediction error for each prediction error in the sequence of prediction errors.

13. The method of claim 11 wherein assembling remaining non-zero bytes into byte-streams includes assembling remaining non-zero bytes into byte-streams based upon a significance of each of the remaining non-zero bytes.

14. The method of claim 1, wherein applying predictive coding is performed on a plurality of sequences of attribute values in parallel.

15. The method of claim 1, wherein applying variable length coding is performed on a plurality of sequences of prediction errors in parallel.

16. The method of claim 1, wherein compressing the byte-streams of variable length codes using entropy coding is performed on a plurality of byte-streams in parallel.

17. The method of claim 1 further comprising storing the compressed byte-streams of variable length codes.

18. The method of claim 1 further comprising transmitting the compressed byte-streams of variable length codes.

19. A medium comprising a non-transitory computer-readable medium including computer-executable instructions adapted to cause a computer to:
receive a dataset to be compressed, the dataset including a plurality of LiDAR data points in a sequence, the data points each including at least four types of attribute values,
the attribute value types including an X-coordinate value type, a Y-coordinate value type, a Z-coordinate value type, and at least one associated scalar value type;
apply predictive coding to a sequence of attribute values of a same type from the dataset to generate a sequence of prediction errors for each of the X-coordinate value type and the scalar value type;
apply predictive coding to a sequence of attribute values of a different type from the dataset to generate a sequence of prediction errors for each of the Y-coordinate value type and the Z-coordinate value type;
apply variable length coding to the sequences of prediction errors to generate byte-streams of variable length codes; and
compress the byte-streams of variable length codes using entropy coding.

20. The medium of claim 19, wherein apply predictive coding for the X-coordinate value type and the scalar value type includes:
receive the sequence of attribute values of the same type;
determine predicted values for each next attribute value in the sequence; and
calculate the sequence of prediction errors based on a difference between corresponding predicted values and attribute values.

21. The medium of claim 20, wherein determine predicted values includes:
apply one of a plurality of prediction rules to the sequence of attribute values based upon the type of attribute values to be predicted.

22. The medium of claim 21, wherein apply one of a plurality of prediction rules includes:
apply a constant prediction rule where no prediction rule for a given attribute type is prescribed;
apply a linear prediction rule where the attribute value type of the sequence of attribute values includes values that vary linearly;
apply an X prediction rule for x-coordinate value type attribute values;
apply a Y prediction rule for y-coordinate value type attribute values; and
apply a Z prediction rule for z-coordinate value type attribute values.

23. The medium of claim 22, wherein apply a linear prediction rule includes apply a linear prediction rule when the attribute values include at least one of GPS recording time of points; intensity of points; and colors of points.

24. The medium of claim 22, wherein apply a constant prediction rule includes estimate a prediction for a next value in the sequence of attribute values based on a previous value in the sequence of attribute values.

25. The medium of claim 22, wherein apply a linear prediction rule includes estimate a prediction for a next value in the sequence of attribute values based on a linear function of previous values.

26. The medium of claim 22, wherein apply the X prediction rule includes:
estimate a prediction for an x-coordinate attribute value of a next data point based on a mean distance between x-coordinate attribute values of previous data points; and
subtract a residual of a previous x-coordinate attribute value from the mean distance if a standard deviation between previous values is larger than a predefined threshold.

27. The medium of claim 22, wherein apply the Y prediction rule includes:

search the sequence of data points for a first pair of successive data points with x-coordinate attribute values that are a distance apart that is less than a predefined amount different than a distance between a current x-coordinate attribute value and a next x-coordinate attribute value;

determine a prediction for the y-coordinate attribute value of a next data point based on a distance between y-coordinate attribute values of the first pair of successive data points if the first pair of successive data points is found; and determine a prediction for the y-coordinate attribute value of a next data point based on a linear interpolation function of distances between previous data points if the first pair of successive data points is not found.

28. The medium of claim 22, wherein apply the Z prediction rule includes:

search the sequence of data points for a first pair of successive data points with both:
(a) x-coordinate attribute values that are a distance apart that is less than a predefined amount different than a distance between a current x-coordinate attribute value and a next x-coordinate attribute value, and
(b) y-coordinate attribute values that are a distance apart that is less than a predefined amount different than a distance between a current y-coordinate attribute value and a next y-coordinate attribute value determine a prediction for the z-coordinate attribute value of a next data point based on a distance between z-coordinate attribute values of the first pair of successive data points if the first pair of successive data points is found; and determine a prediction for the z-coordinate attribute value of a next data point based on a linear interpolation function of distances between previous data points if the first pair of successive data points is not found.

29. The medium of claim 19, wherein apply variable length coding to the sequence of prediction errors to generate byte-streams of variable length codes includes:

assign description bytes to each prediction error in the sequence of prediction errors, wherein each prediction error is represented by bits indicating sign and size;
divide the description bytes into strings of bytes;
remove zero-bytes from the strings of bytes based on a size of the description bytes; and
assemble remaining non-zero bytes into byte-streams.

30. The medium of claim 29, wherein assign description bytes includes:

store information indicative of a sign of the prediction error for each prediction error in the sequence of prediction errors; and
store information indicative of an absolute value of the prediction error for each prediction error in the sequence of prediction errors.

31. The medium of claim 29 wherein assemble remaining non-zero bytes into byte-streams includes assemble remaining non-zero bytes into byte-streams based upon a significance of each of the remaining non-zero bytes.

32. The medium of claim 19, wherein apply predictive coding is performed on a plurality of sequences of attribute values in parallel.

33. The medium of claim 19, wherein apply variable length coding is performed on a plurality of sequences of prediction errors in parallel.

34. The medium of claim 19, wherein compress the byte-streams of variable length codes using entropy coding is performed on a plurality of byte-streams in parallel.

35. The medium of claim 19 wherein the computer-executable instructions are further adapted to cause the computer to store the compressed byte-streams of variable length codes.

36. The medium of claim 19 wherein the computer-executable instructions are further adapted to cause the computer to transmit the compressed byte-streams of variable length codes.

37. A computer programmed to compress three dimensional LiDAR point data, the computer comprising:

a processor; and
a memory coupled to the processor and operable to store computer-executable instructions adapted to cause the computer to:
receive a dataset to be compressed, the dataset including a plurality of data points in a sequence,
the data points each including at least four types of attribute values, the attribute value types including an X-coordinate value type, a Y-coordinate value type, a Z-coordinate value type, and at least one associated scalar value type;
apply predictive coding to a sequence of attribute values of a same type from the dataset to generate a sequence of prediction errors for a each of the X-coordinate value type and the scalar value type;
apply predictive coding to a sequence of attribute values of a different type from the dataset to generate a sequence of prediction errors for each of the Y-coordinate value type and the Z-coordinate value type;
apply variable length coding to the sequences of prediction errors to generate byte-streams of variable length codes; and
compress the byte-streams of variable length codes using entropy coding.

38. The computer of claim 37, wherein apply predictive coding for the X-coordinate value type and the scalar value type includes:

receive the sequence of attribute values of the same type;
determine predicted values for each next attribute value in the sequence; and
calculate the sequence of prediction errors based on a difference between corresponding predicted values and attribute values.

39. The computer of claim 38, wherein determine predicted values includes:

apply one of a plurality of prediction rules to the sequence of attribute values based upon the type of attribute values to be predicted.

40. The computer of claim 39, wherein apply one of a plurality of prediction rules includes:

apply a constant prediction rule where no prediction rule for a given attribute type is prescribed;
apply a linear prediction rule where the attribute value type of the sequence of attribute values includes values that vary linearly;
apply an X prediction rule for x-coordinate value type attribute values;
apply a Y prediction rule for y-coordinate value type attribute values; and
apply a Z prediction rule for z-coordinate value type attribute values.

41. The computer of claim 40, wherein apply a linear prediction rule includes apply a linear prediction rule when the attribute values include at least one of GPS recording time of points; intensity of points; and colors of points.

42. The computer of claim 40, wherein apply a constant prediction rule includes estimate a prediction for a next value in the sequence of attribute values based on a previous value in the sequence of attribute values.

43. The computer of claim 40, wherein apply a linear prediction rule includes estimate a prediction for a next value in the sequence of attribute values based on a linear function of previous values.

44. The computer of claim 40, wherein apply the X prediction rule includes:
   estimate a prediction for an x-coordinate attribute value of a next data point based on a mean distance between x-coordinate attribute values of previous data points; and
   subtract a residual of a previous x-coordinate attribute value from the mean distance if a standard deviation between previous values is larger than a predefined threshold.

45. The computer of claim 40, wherein apply the Y prediction rule includes:
   search the sequence of data points for a first pair of successive data points with x-coordinate attribute values that are a distance apart that is less than a predefined amount different than a distance between a current x-coordinate attribute value and a next x-coordinate attribute value;
   determine a prediction for the y-coordinate attribute value of a next data point based on a distance between y-coordinate attribute values of the first pair of successive data points if the first pair of successive data points is found; and
   determine a prediction for the y-coordinate attribute value of a next data point based on a linear interpolation function of distances between previous data points if the first pair of successive data points is not found.

46. The computer of claim 40, wherein apply the Z prediction rule includes:
   search the sequence of data points for a first pair of successive data points with both:
   (a) x-coordinate attribute values that are a distance apart that is less than a predefined amount different than a distance between a current x-coordinate attribute value and a next x-coordinate attribute value, and
   (b) y-coordinate attribute values that are a distance apart that is less than a predefined amount different than a distance between a current y-coordinate attribute value and a next y-coordinate attribute value
   determine a prediction for the z-coordinate attribute value of a next data point based on a distance between z-coordinate attribute values of the first pair of successive data points if the first pair of successive data points is found; and
   determine a prediction for the z-coordinate attribute value of a next data point based on a linear interpolation function of distances between previous data points if the first pair of successive data points is not found.

47. The computer of claim 37, wherein apply variable length coding to the sequence of prediction errors to generate byte-streams of variable length codes includes:
   assign description bytes to each prediction error in the sequence of prediction errors, wherein each prediction error is represented by bits indicating sign and size;
   divide the description bytes into strings of bytes;
   remove zero-bytes from the strings of bytes based on a size of the description bytes; and
   assemble remaining non-zero bytes into byte-streams.

48. The computer of claim 47, wherein assign description bytes includes:
   store information indicative of a sign of the prediction error for each prediction error in the sequence of prediction errors; and
   store information indicative of an absolute value of the prediction error for each prediction error in the sequence of prediction errors.

49. The computer of claim 47 wherein assemble remaining non-zero bytes into byte-streams includes assemble remaining non-zero bytes into byte-streams based upon a significance of each of the remaining non-zero bytes.

50. The computer of claim 37, wherein apply predictive coding is performed on a plurality of sequences of attribute values in parallel.

51. The computer of claim 37, wherein apply variable length coding is performed on a plurality of sequences of prediction errors in parallel.

52. The computer of claim 37, wherein compress the byte-streams of variable length codes using entropy coding is performed on a plurality of byte-streams in parallel.

53. The computer of claim 37 wherein the computer-executable instructions are further adapted to cause the computer to store the compressed byte-streams of variable length codes.

54. The computer of claim 37 wherein the computer-executable instructions are further adapted to cause the computer to transmit the compressed byte-streams of variable length codes.

* * * * *